US012699331B2

(12) United States Patent
Venkatesan

(10) Patent No.: US 12,699,331 B2
(45) Date of Patent: Aug. 4, 2026

(54) SELF-ALIGNED RIDGE WAVEGUIDE LASER STRUCTURE, METHOD FOR FABRICATION, AND METHOD FOR USE WITH INTERPOSER-BASED PICS

(71) Applicant: POET Technologies, Inc., San Jose, CA (US)

(72) Inventor: Suresh Venkatesan, Los Gatos, CA (US)

( * ) Notice: Subject to any disclaimer, the term of this patent is extended or adjusted under 35 U.S.C. 154(b) by 936 days.

(21) Appl. No.: 17/752,226

(22) Filed: May 24, 2022

(65) Prior Publication Data

US 2023/0130757 A1     Apr. 27, 2023

Related U.S. Application Data

(60) Provisional application No. 63/192,800, filed on May 25, 2021.

(51) Int. Cl.
| | |
|---|---|
| *G03F 9/00* | (2006.01) |
| *G02B 6/42* | (2006.01) |
| *H01S 5/20* | (2006.01) |
| *H01S 5/22* | (2006.01) |
| *H01S 5/343* | (2006.01) |

(52) U.S. Cl.
CPC ............. *G03F 9/7007* (2013.01); *G02B 6/42* (2013.01); *H01S 5/209* (2013.01); *H01S 5/2214* (2013.01); *H01S 5/343* (2013.01)

(58) Field of Classification Search
CPC ................... G03F 9/7007; G02B 6/42; G02B 2006/12121; G02B 2006/12173; G02B 2006/12176; H01S 5/209; H01S 5/2214; H01S 5/343; H01S 5/0234; H01S 5/0238; H01S 5/22
See application file for complete search history.

(56) References Cited

U.S. PATENT DOCUMENTS

| | | | | |
|---|---|---|---|---|
| 5,793,913 | A * | 8/1998 | Kovacic ................... | G02B 6/42 257/13 |
| 8,638,485 | B2 * | 1/2014 | Feng ...................... | G02F 1/0147 372/50.1 |
| 2008/0151955 | A1 * | 6/2008 | Behfar ...................... | H01S 5/22 438/694 |

(Continued)

FOREIGN PATENT DOCUMENTS

| | | | | |
|---|---|---|---|---|
| EP | 2312357 | B1 * | 11/2017 | ............. G02B 6/423 |
| JP | 2009194231 | A * | 8/2009 | |

OTHER PUBLICATIONS

JP-2009194231-A, Machine Translation (Year: 2025).*

*Primary Examiner* — Binh X Tran
*Assistant Examiner* — Christopher Remavege

(57) ABSTRACT

A structure and method for providing alignment aids that are co-fabricated with the optical emission output from a laser pedestal are described. In embodiments, the alignment aids are formed using processes and masking layers that produce a ridge waveguide laser structure. The use of same masking processes for the laser and the alignment aids provides lithographic level precision in the positioning of the alignment aids in relation to the optical output from the laser device. Optoelectrical die formed with the alignment aids may be used with complementary interposer structures to enable alignment of optical output from lasers formed on the optoelectrical die with optical devices on the interposer.

20 Claims, 34 Drawing Sheets

(56)                References Cited

U.S. PATENT DOCUMENTS

| | | | |
|---|---|---|---|
| 2010/0329296 A1* | 12/2010 | Hata ..................... | H01S 5/0238 |
| | | | 372/50.12 |
| 2016/0252688 A1* | 9/2016 | Barwicz .............. | G02B 6/1225 |
| | | | 385/14 |
| 2024/0168229 A1* | 5/2024 | McKee .................. | G02B 6/136 |

* cited by examiner

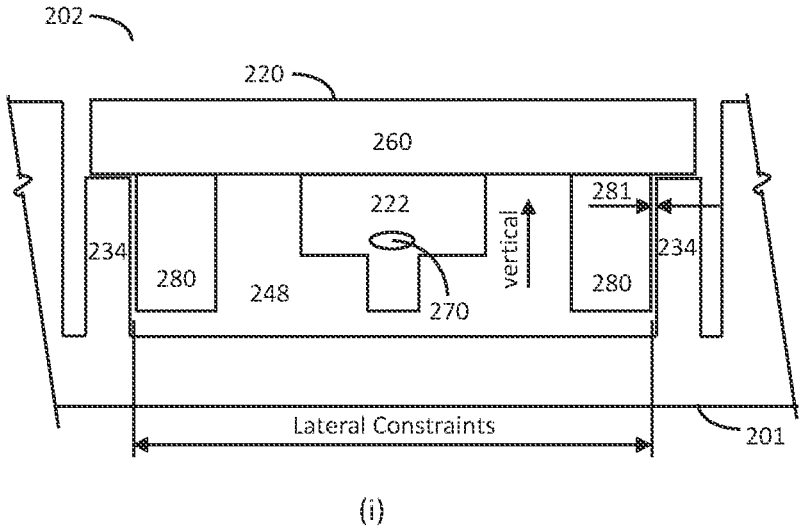
(i)
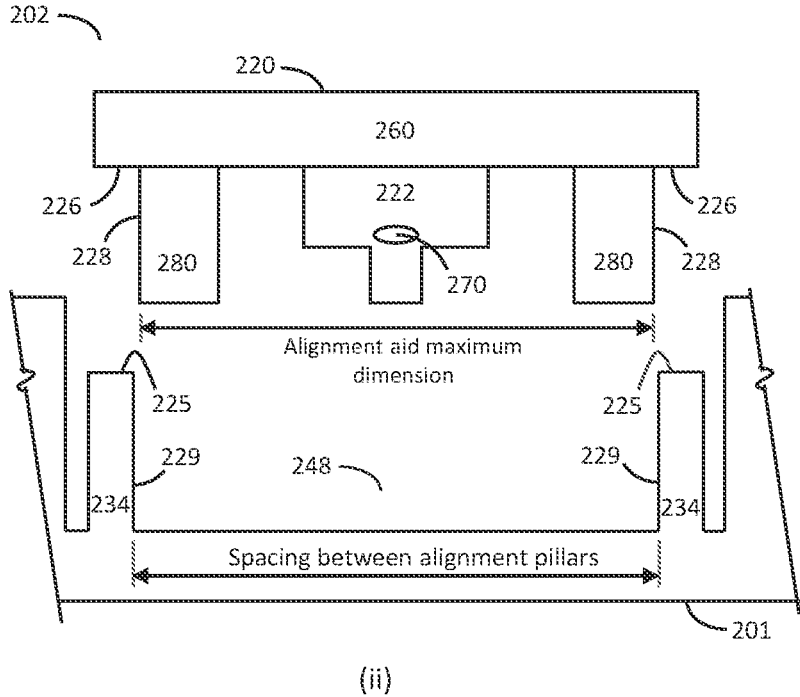
(ii)
FIG. 2A

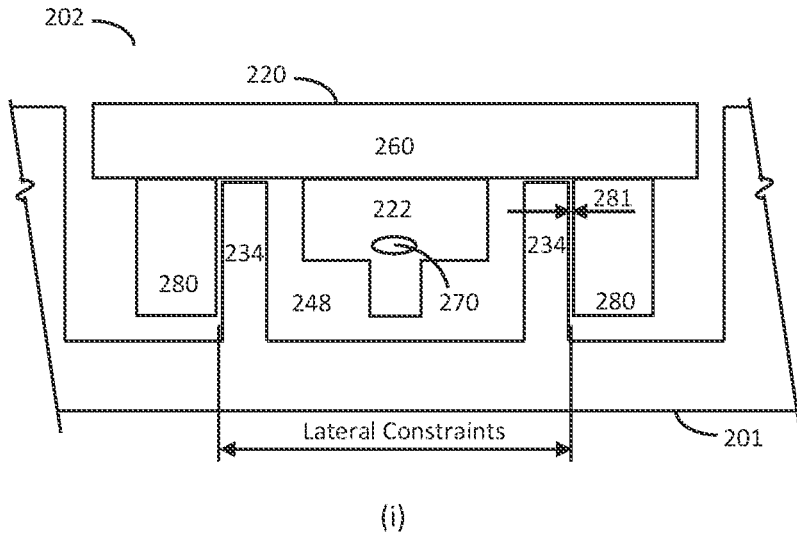
(i)
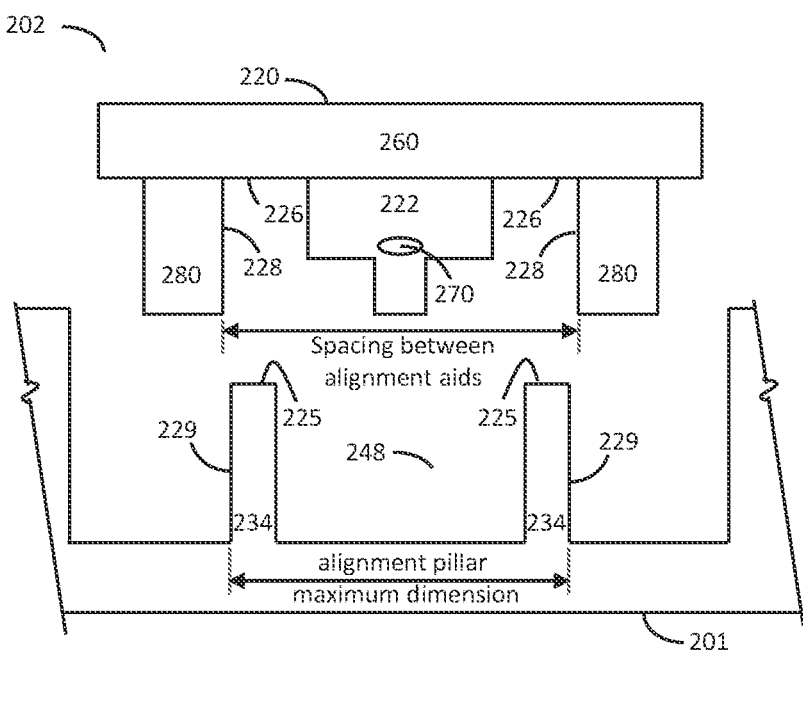
(ii)
FIG. 2B

*310*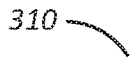

| Forming a substrate with an optional first etch stop layer     *390* |
|---|

| Forming a stack of semiconductor layers for a ridge waveguide laser that may include an optional second etch stop layer below the ridge waveguide layer     *392* |
|---|

| Forming a first patterned mask layer     *393* |
|---|

| Patterning a first portion of the semiconductor stack to form all or a portion of the ridge waveguide of a laser diode and to form the top portion of one or more alignment aids     *394* |
|---|

| Forming a patterned second mask layer     *395* |
|---|

| Patterning a second portion of the semiconductor stack to form a bottom portion of the laser diode and the bottom portion of one or more alignment aids     *396* |
|---|

| Continue processing     *397* |
|---|

FIG. 3

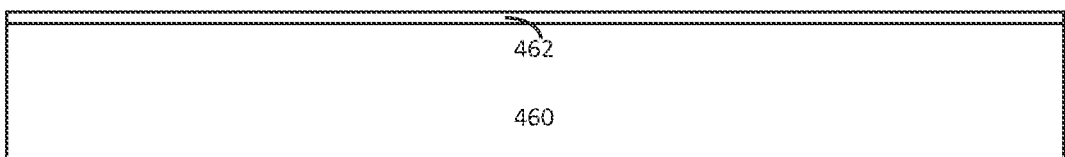
FIG. 4A(i)
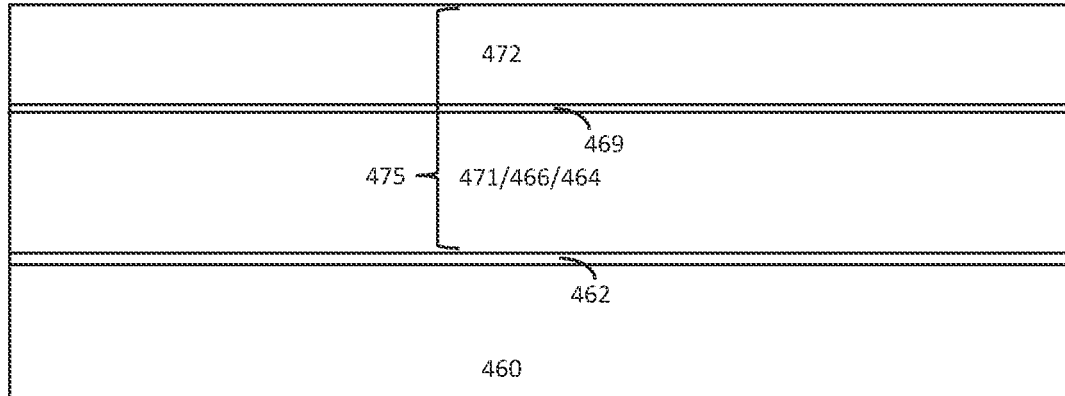
FIG. 4A(ii)
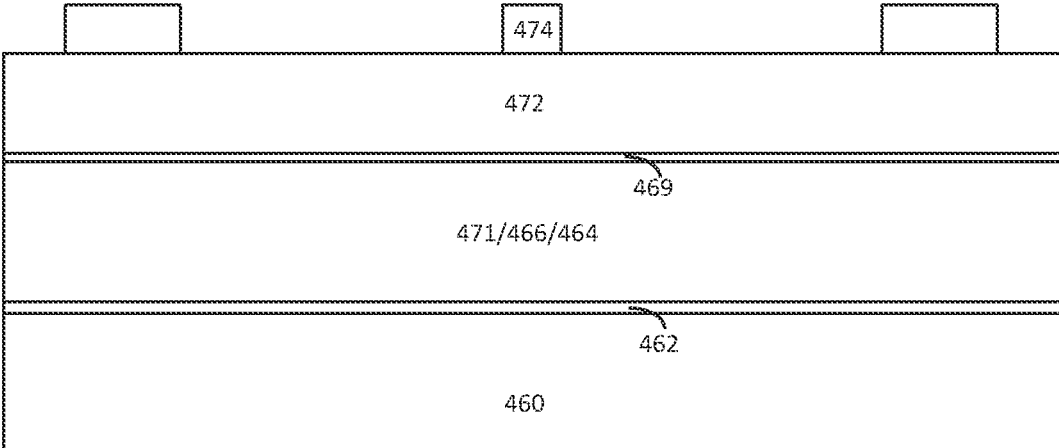
FIG. 4A(iii)

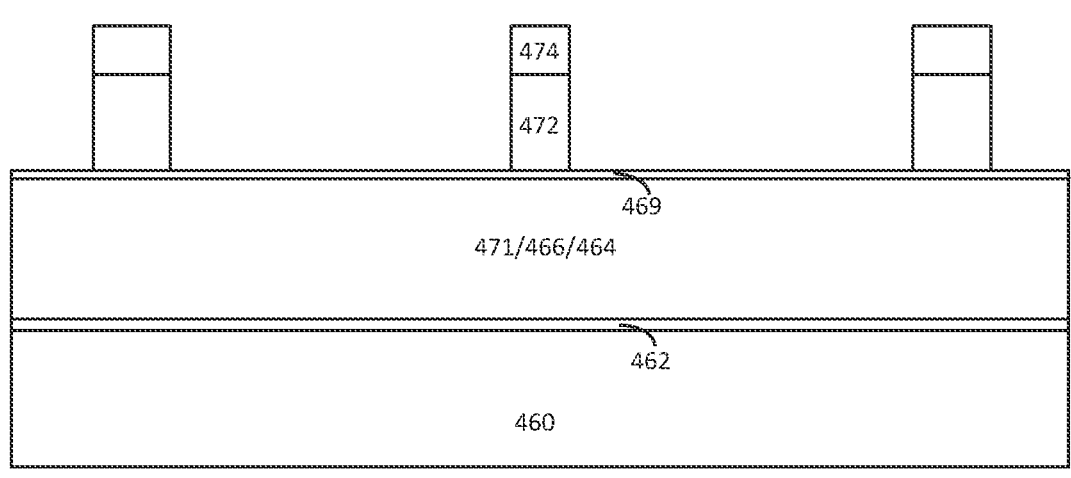
FIG. 4A(iv)
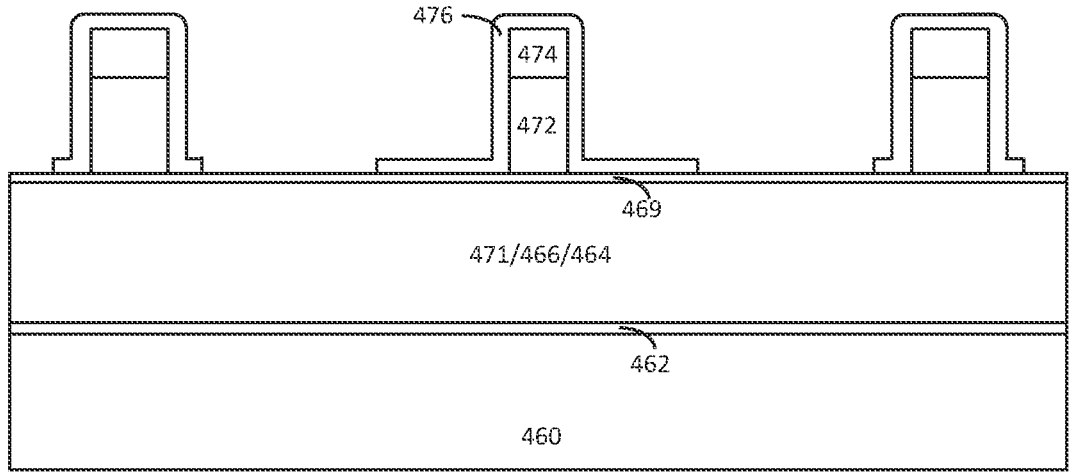
FIG. 4A(v)
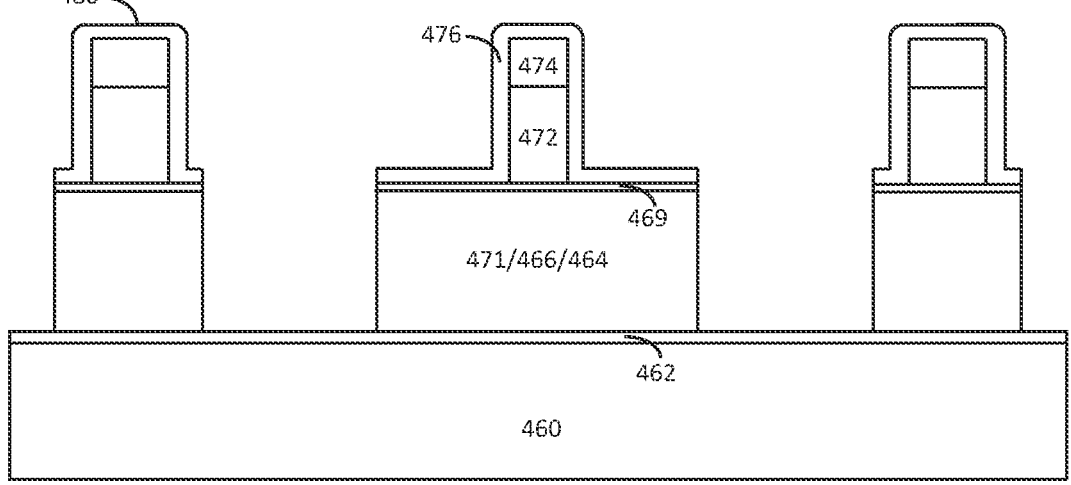
FIG. 4A(vi)

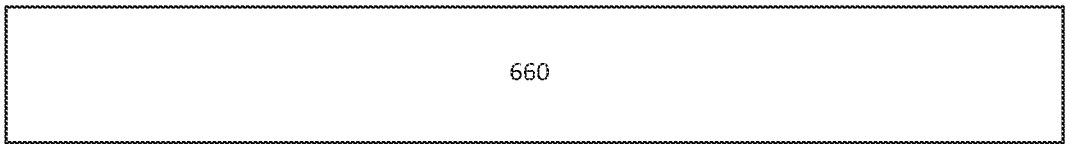
FIG. 6A(i)
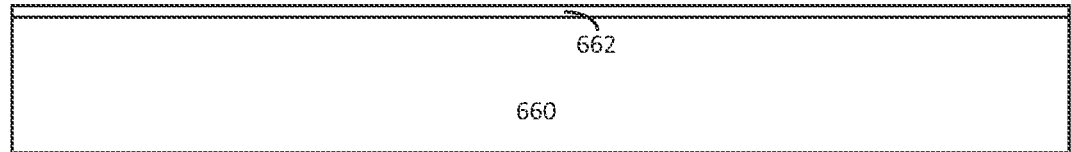
FIG. 6A(ii)
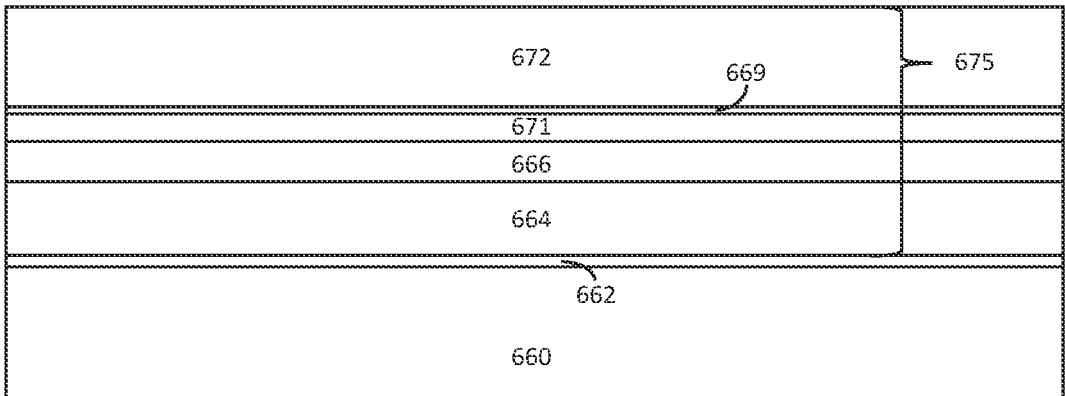
FIG. 6A(iii)
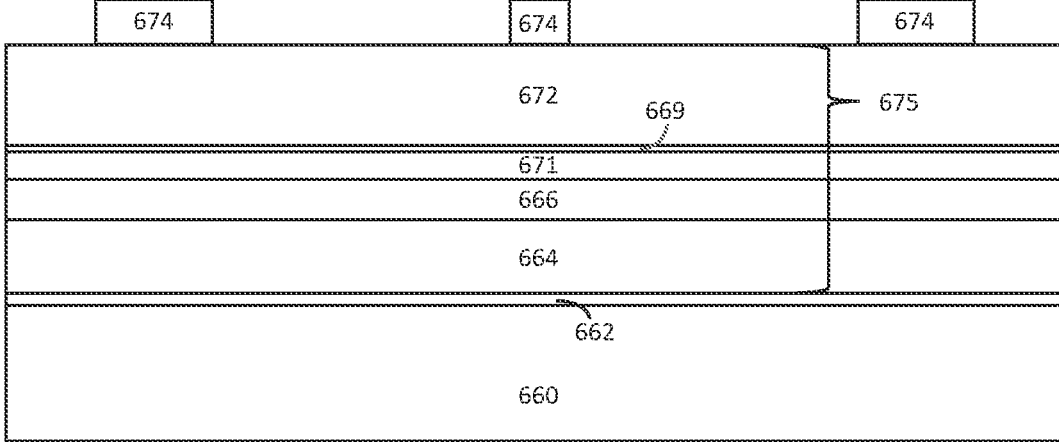
FIG. 6A(iv)

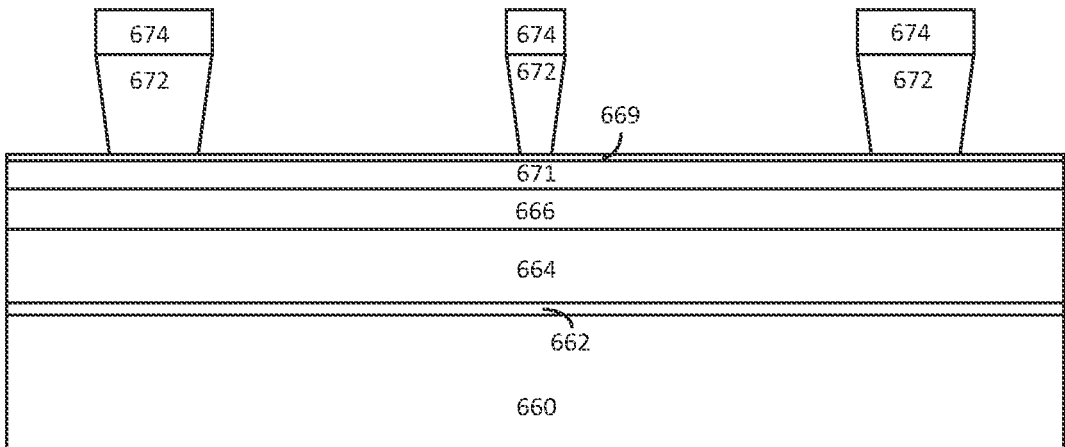
FIG. 6A(v)
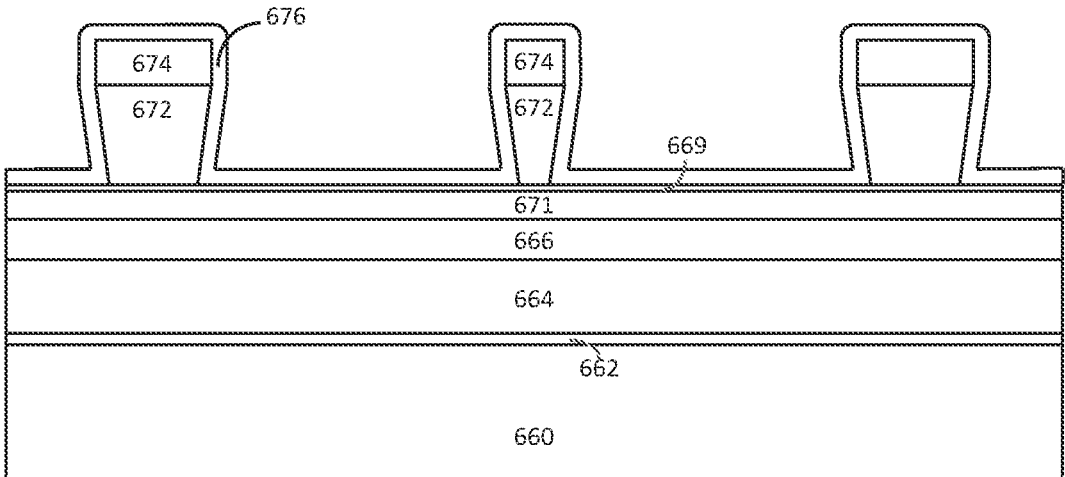
FIG. 6A(vi)

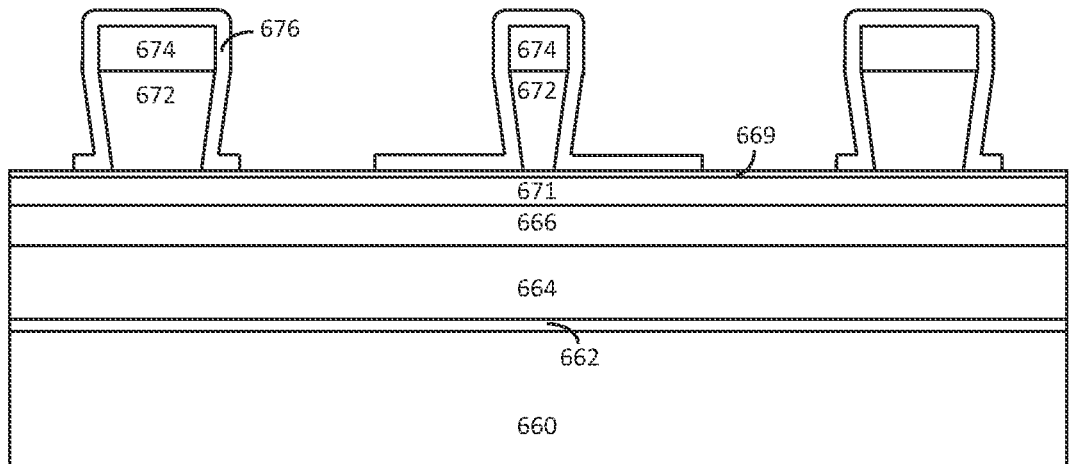
FIG. 6A(vii)
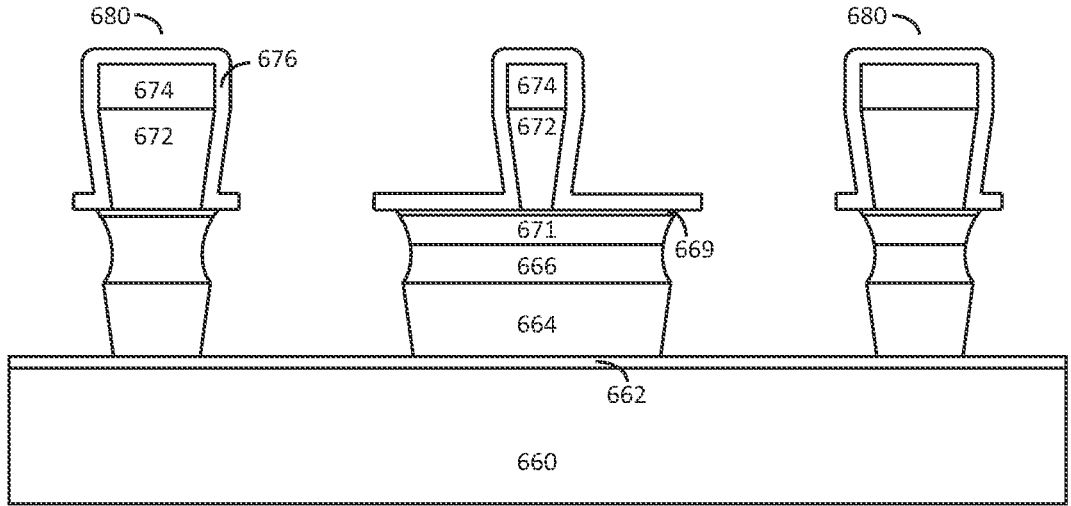
FIG. 6A(viii)

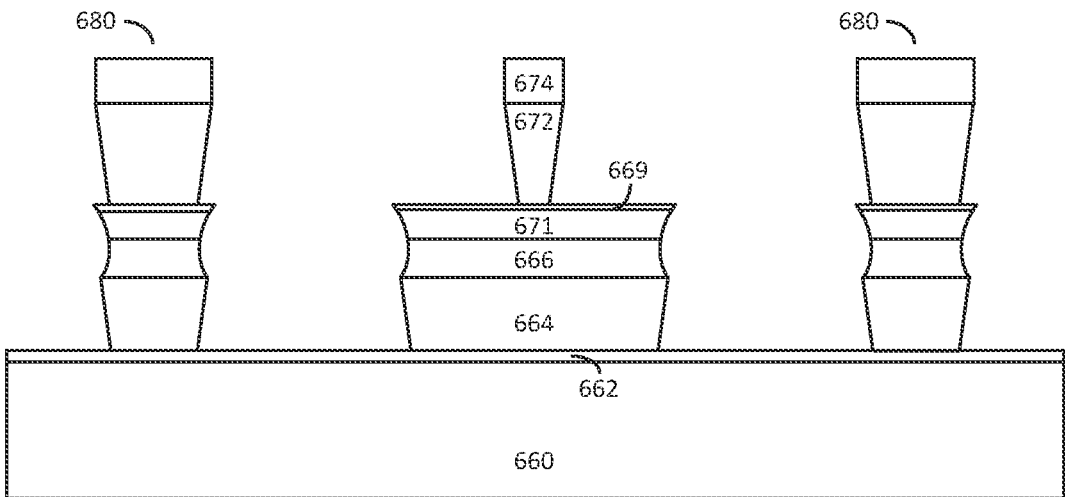
FIG. 6A(ix)
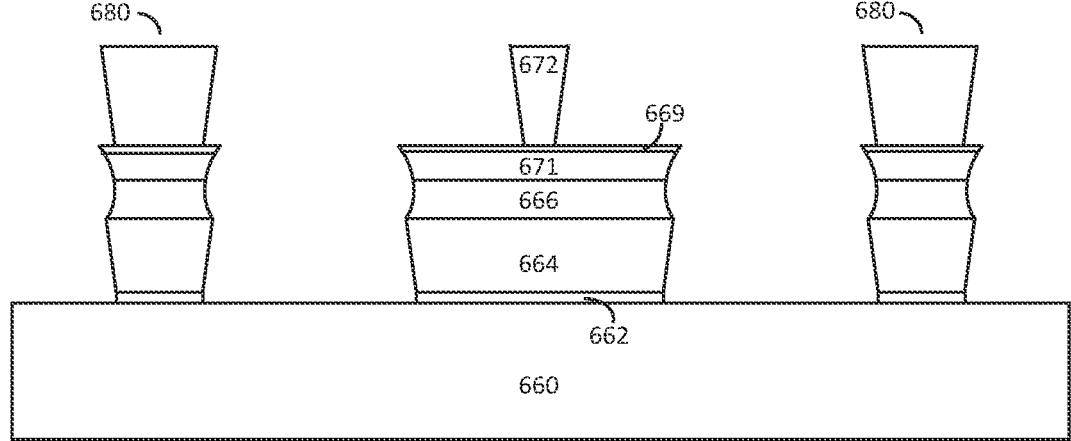
FIG. 6A(x)

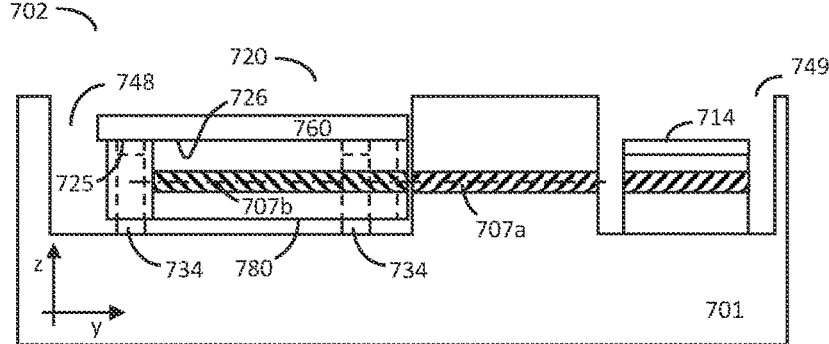
Section A-A'
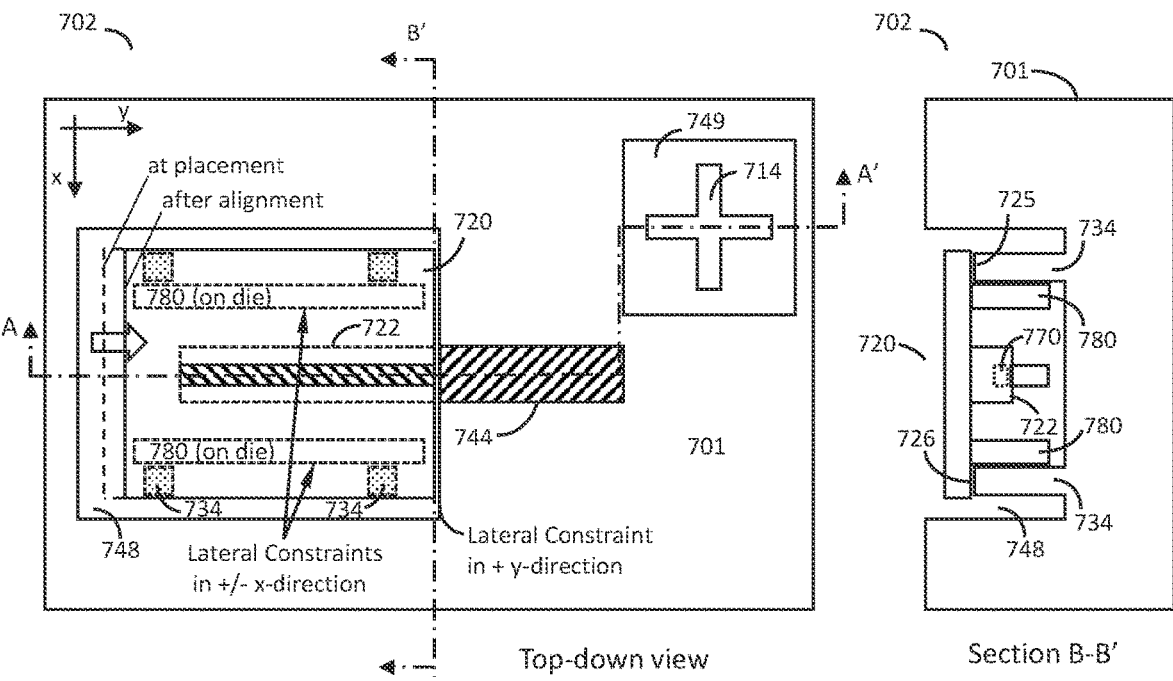
Top-down view                Section B-B'
FIG. 7

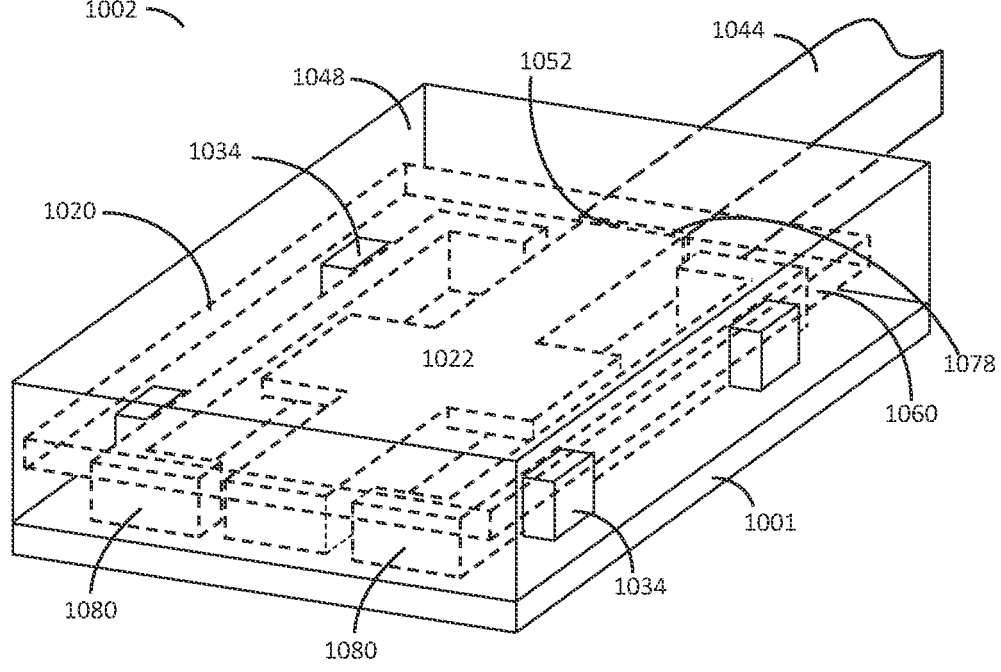
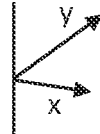
FIG. 10B

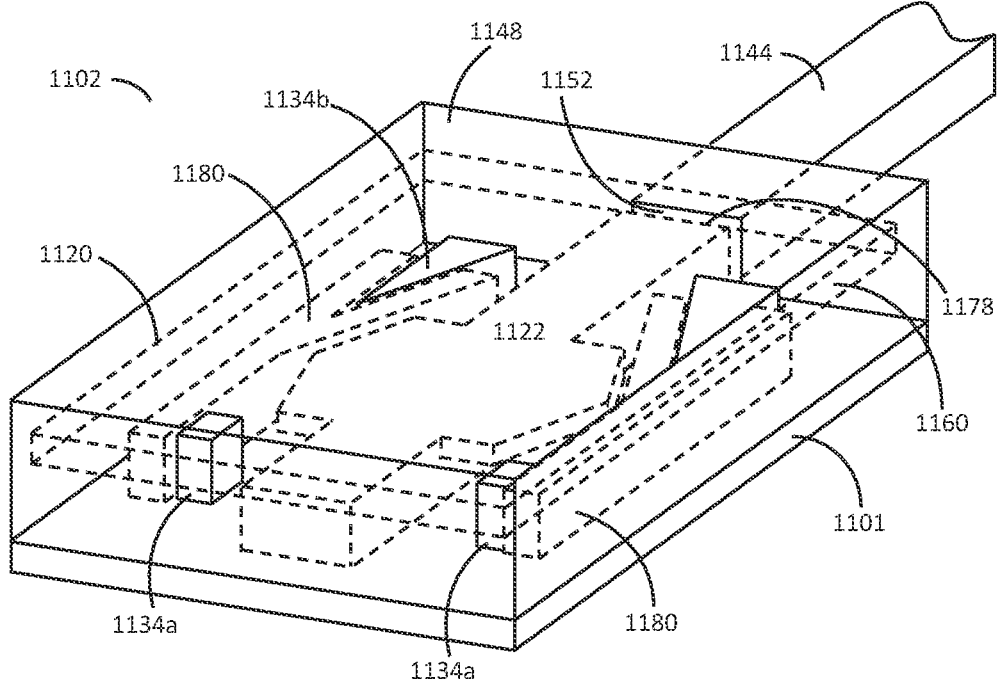
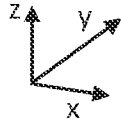
FIG. 11B

Direction of lateral movement of die 1220; interposer alignment pillars 1234 are fixed

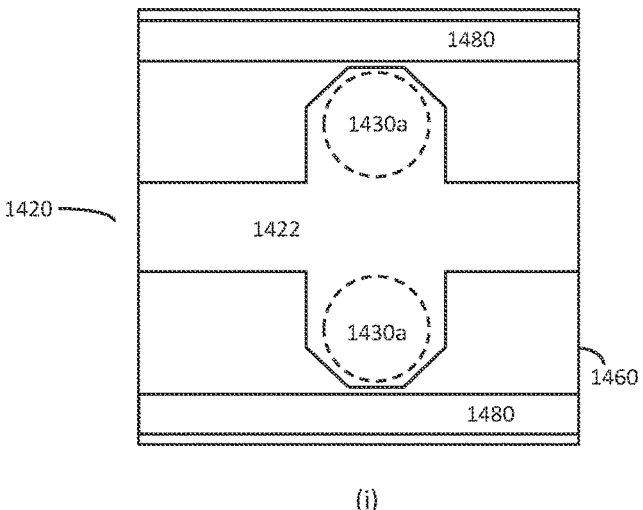
(i)
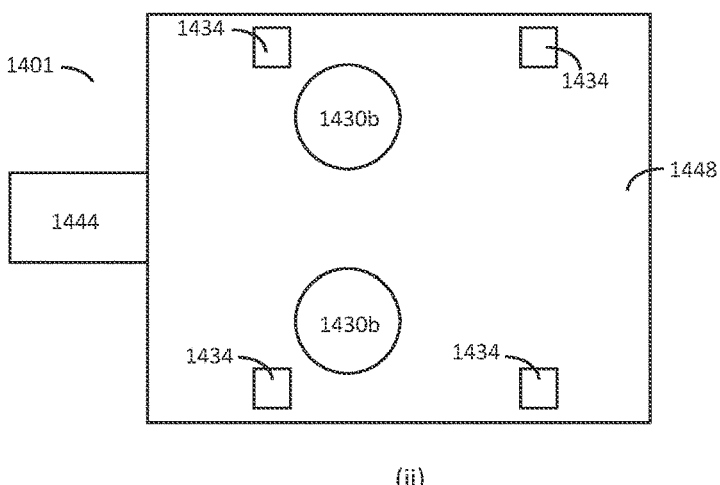
(ii)
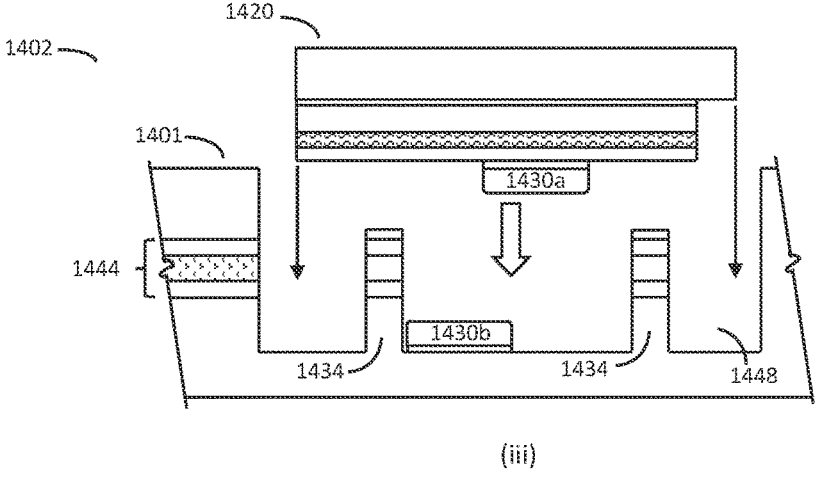
(iii)
FIG. 14A

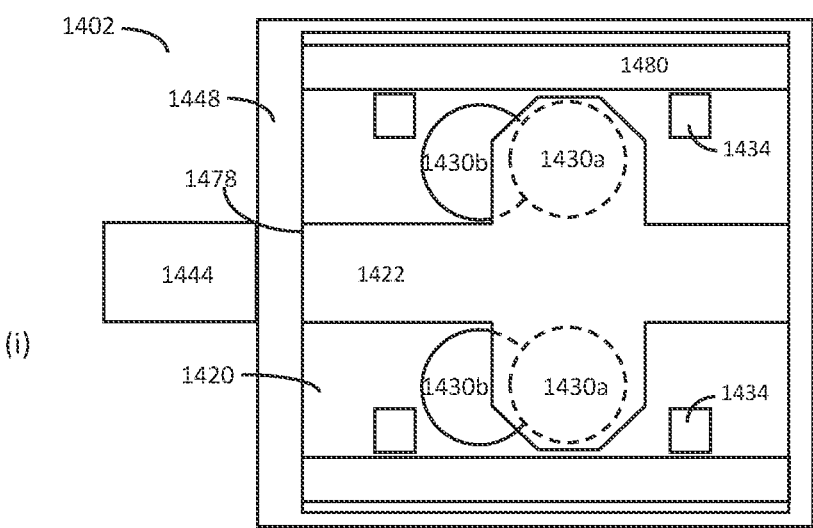
(i)
Before alignment
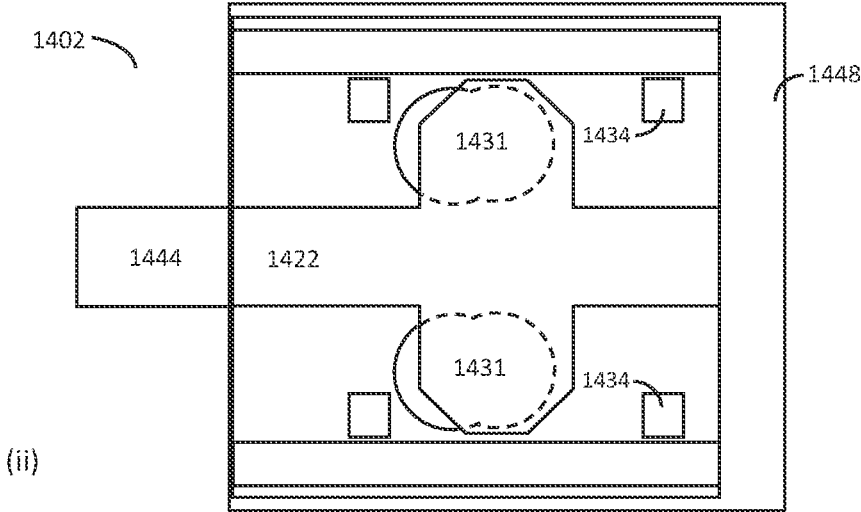
(ii)
After heating & alignment
FIG. 14C

SELF-ALIGNED RIDGE WAVEGUIDE LASER STRUCTURE, METHOD FOR FABRICATION, AND METHOD FOR USE WITH INTERPOSER-BASED PICS

The present application claims priority from U.S. Provisional Patent Application Ser. No. 63/192,800, filed on May 25, 2021, entitled: "SELF-ALIGNED RIDGE WAVE-GUIDE LASER STRUCTURE, METHOD FOR FABRICATION, AND METHOD FOR USE WITH INTER-POSER-BASED PICS".

FIELD OF THE INVENTION

The present invention relates to the formation of photonic integrated circuits, and more particularly to structures and methods for the alignment of an optoelectrical die that include one or more ridge waveguide lasers with interposer-based optical devices.

BACKGROUND

Developments in the methods of manufacturing photonic integrated circuits (PICs) have enabled the fabrication and integration of electrical, optoelectrical, and optical devices on the same substrate. In some applications, pre-fabricated optoelectrical die are integrated within the PICs to provide functionality that may not be easily obtainable with similar devices formed directly on or within the substrate. Semi-conductor lasers that emit signals at specific optical wavelengths suited for optical communications, for example, are readily fabricated from indium phosphide and gallium arsenide semiconductor materials. The fabrication of optical devices from these materials directly on silicon or insulating substrates is not economically practical or technologically achievable, however, and thus the integration of pre-fabricated lasers into PICs that utilize silicon or insulating substrates is preferred for communication applications that require commonly utilized optical wavelengths. The integration of optoelectrical die with pre-fabricated lasers into PICs often requires precise placement onto the substrate and the subsequent alignment after placement of the optical and electrical features on the die with optical and electrical features on the substrate. Optical output from an integrated laser die, for example, must align with optical planar waveguides or other optical devices on the substrate to enable effective integration of the laser with other devices in the optoelectrical or optical circuits on the PIC substrate.

Effective alignment methodologies can benefit both technically and economically from the formation of alignment structures on the optoelectrical die that are compatible with alignment structures that are formed on the PIC substrate. Methodologies, for example, that enable the implementation of passive alignment techniques during the alignment process are preferable over techniques and integration schemes that require potentially time-consuming active alignment steps. The formation of the alignment structures or mechanical alignment aids that are compatible with available PIC fabrication techniques and methods, and suitable for high-volume production are also preferable.

Thus, a need in the art exists for device structures and methods that allow for passive integration of optoelectrical devices such as semiconductor lasers and photodiodes and that provide suitable referencing schemes to enable effective alignment of integrated optoelectrical die with waveguides and other optical and electrical features on the PIC substrate during the fabrication of PICs.

SUMMARY OF THE INVENTION

Embodiments of structures and methodologies are described herein for the formation of mechanical alignment aids that are formed on optoelectrical die and that include one or more ridge waveguide lasers. The mechanical alignment aids are formed using a common process compatible for both the ridge waveguide laser structure and the alignment aids, and that includes the use of common lithographic patterning steps to ensure lithography-level precision in the dimensional spacing between the optical emission zone of the laser and the mechanical alignment features of the alignment aids.

Ridge waveguide (RWG) lasers that are used in the formation of optical communication-based PICs, for example, commonly utilize indium phosphide-based and gallium arsenide-based semiconductor compounds and the graded semiconductor layers used to form the application-specific electronic bandgap structures associated with these compound semiconductor materials. Embodiments of co-fabricated RWG lasers and mechanical alignment aids are formed from these compound semiconductor materials.

Mechanical alignment features formed on the optoelectrical die are particularly beneficial for providing alignment within the lateral plane of the substrate. The use of the same lithographic patterning techniques and methods for the formation of the alignment aids and the ridge waveguide laser provides lithographic levels of precision in the spacing between the optical output of the laser and the mechanical features of the alignment aids. Used in combination with the lithographically aligned alignment pillars formed on the interposer, the use of these lasers provides a high degree of positioning accuracy and enables efficient transfer of the optical signal from the laser to a waveguide or other optical device on interposers to which the laser die are mounted.

In some embodiments, the structures and methodologies for alignment include the formation and implementation of mechanical alignment features on both the optoelectrical die and on the interposer-based PIC substrates upon which the optoelectrical die are integrated. The integration of pre-formed optoelectrical and optical die into interposers, in embodiments, benefits from the inclusion of mechanical alignment features and the associated protocols that enable the utilization of these mechanical alignment features to achieve improved operational performance such as, for example, efficient transfer of optical signals from the mounted lasers to optical devices such as waveguides on the interposer. In embodiments, mechanical alignment features can include the use of mechanical stops that are formed both on the optoelectrical die and in combination with complementary-shaped alignment aids and mechanical stops that are formed on the interposer of the interposer-based PIC substrate. Complementary-shaped alignment aids and mechanical stops are shaped to facilitate lateral alignment of one or more optical axes of devices on the optoelectrical die with the optical axes of devices on the interposer.

Simplifications in alignment structures and procedures, in embodiments described herein, allow for passive alignment processes that are economically beneficial over techniques that require active or interactive alignment processes. Additionally, the simplified alignment structures and associated processes can provide further benefit by reducing the optical or electrical losses that result from misaligned or inadequately aligned devices in photonic integrated circuits that utilize these structures. Thusly, the techniques described herein offer technical advantages and economic advantages in the alignment of optical and electrical features of mounted optoelectrical and optical die and the interposers or substrates to which these die are attached. Embodiments described herein can be used in the formation of interposer-based PICS that utilize ridge waveguide lasers.

BRIEF DESCRIPTION OF THE DRAWINGS

FIG. 2A shows a schematic drawing of an embodiment of a ridge waveguide laser and interposer assembly with mechanical alignment aids on the laser die and on the interposer substrate.

FIG. 2B shows a schematic drawing of an embodiment of a ridge waveguide laser and interposer assembly with mechanical alignment aids on the laser die and on the interposer substrate.

FIG. 3 shows an embodiment of a Process flow for the formation of a laser die with alignment aids.

FIG. 4A(i) shows a portion of the process flow for the fabrication of embodiments of the RWG laser optoelectrical die with mechanical alignment aids that mounts onto the interposer, and that includes the formation of a substrate with an optional first etch stop layer (Step 390 of Process 310).

FIG. 4A(ii) shows a portion of the process flow for the fabrication of embodiments of the RWG laser optoelectrical die with mechanical alignment aids that mounts onto the interposer, and that includes the formation of a stack of semiconductor layers (Step 392 of Process 310).

FIG. 4A(iii) shows a portion of the process flow for the fabrication of embodiments of the RWG laser optoelectrical die with mechanical alignment aids that mounts onto the interposer, and that includes the formation of a patterned first mask layer (Step 393 of Process 310).

FIG. 4A(iv) shows a portion of the process flow for the fabrication of embodiments of the RWG laser optoelectrical die with mechanical alignment aids that mounts onto the interposer that includes the patterning of the RWG layer of the stack of the semiconductor layers, and including the mechanical alignment aid features (Step 394 of Process 310).

FIG. 4A(v) shows a portion of the process flow for the fabrication of embodiments of the RWG laser optoelectrical die with mechanical alignment aids that mounts onto the interposer, and that includes the formation of a patterned second mask layer (Step 395 of Process 310).

FIG. 4A(vi) shows a portion of the process flow for the fabrication of embodiments of the RWG laser optoelectrical die with mechanical alignment aids that mounts onto the interposer that includes the patterning of the lower layers of the stack of the semiconductor layers of the RWG laser and the mechanical alignment aid features (Step 396 of Process 310).

FIG. 6A(ii) shows a portion of the process flow of the embodiment described in FIG. 5 for the fabrication of the RWG laser optoelectrical die with mechanical alignment aids that includes the formation of an optional first etch stop layer.

FIG. 6A(iii) shows a portion of the process flow of the embodiment described in FIG. 5 for the fabrication of the RWG laser optoelectrical die with mechanical alignment aids.

FIG. 6A(iv) shows a portion of the process flow of the embodiment described in FIG. 5 for the fabrication of the RWG laser optoelectrical die with mechanical alignment aids.

FIG. 6A(v) shows a portion of the process flow of the embodiment described in FIG. 5 for the fabrication of the RWG laser optoelectrical die with mechanical alignment aids.

FIG. 6A(vi) shows a portion of the process flow of the embodiment described in FIG. 5 for the fabrication of the RWG laser optoelectrical die with mechanical alignment aids.

FIG. 6A(vii) shows a portion of the process flow of the embodiment described in FIG. 5 for the fabrication of the RWG laser optoelectrical die with mechanical alignment aids.

FIG. 6A(viii) shows a portion of the process flow of the embodiment described in FIG. 5 for the fabrication of the RWG laser optoelectrical die with mechanical alignment aids.

FIG. 6A(ix) shows a portion of the process flow of the embodiment described in FIG. 5 for the fabrication of the RWG laser optoelectrical die with mechanical alignment aids.

FIG. 6A(x) shows a portion of the process flow of the embodiment described in FIG. 5 for the fabrication of the RWG laser optoelectrical die with mechanical alignment aids.

FIG. 7 shows cross section and top-down schematic views of an optical die with aligned lateral and vertical optical signal planes shown with mechanical alignment aids on the optoelectrical die and on the interposer.

FIG. 10B shows a perspective drawing of an optoelectrical planar laser die with mechanical alignment aids (dotted lines) mounted in a cavity or recess on a portion of an interposer substrate (solid lines) with complementary mechanical alignment aids. Also shown is a portion of a planar waveguide of the interposer in alignment with the optical facet of the planar laser.

FIG. 11B shows a perspective drawing of an optoelectrical planar laser die with mechanical alignment aids (dotted lines) mounted in a cavity or recess on a portion of an interposer substrate (solid lines) with complementary mechanical alignment aids. Also shown is a portion of a planar waveguide of the interposer in alignment with the optical facet of the planar laser.

FIG. 14A shows (i) a top-down schematic view of an embodiment of an optoelectrical die with alignment aids shown with metallization, (ii) a portion of an embodiment of an interposer with complementary alignment pillars also shown with metallization, and (iii) a side view of an assembly of the optoelectrical die and the portion of the interposer.

FIG. 14C shows top-down schematic view of an embodiment of an optoelectrical die on an interposer with metallization (i) before alignment of the optical features and (ii) after alignment of the optical features.

DETAILED DESCRIPTION OF THE EMBODIMENTS

Figure 1A:
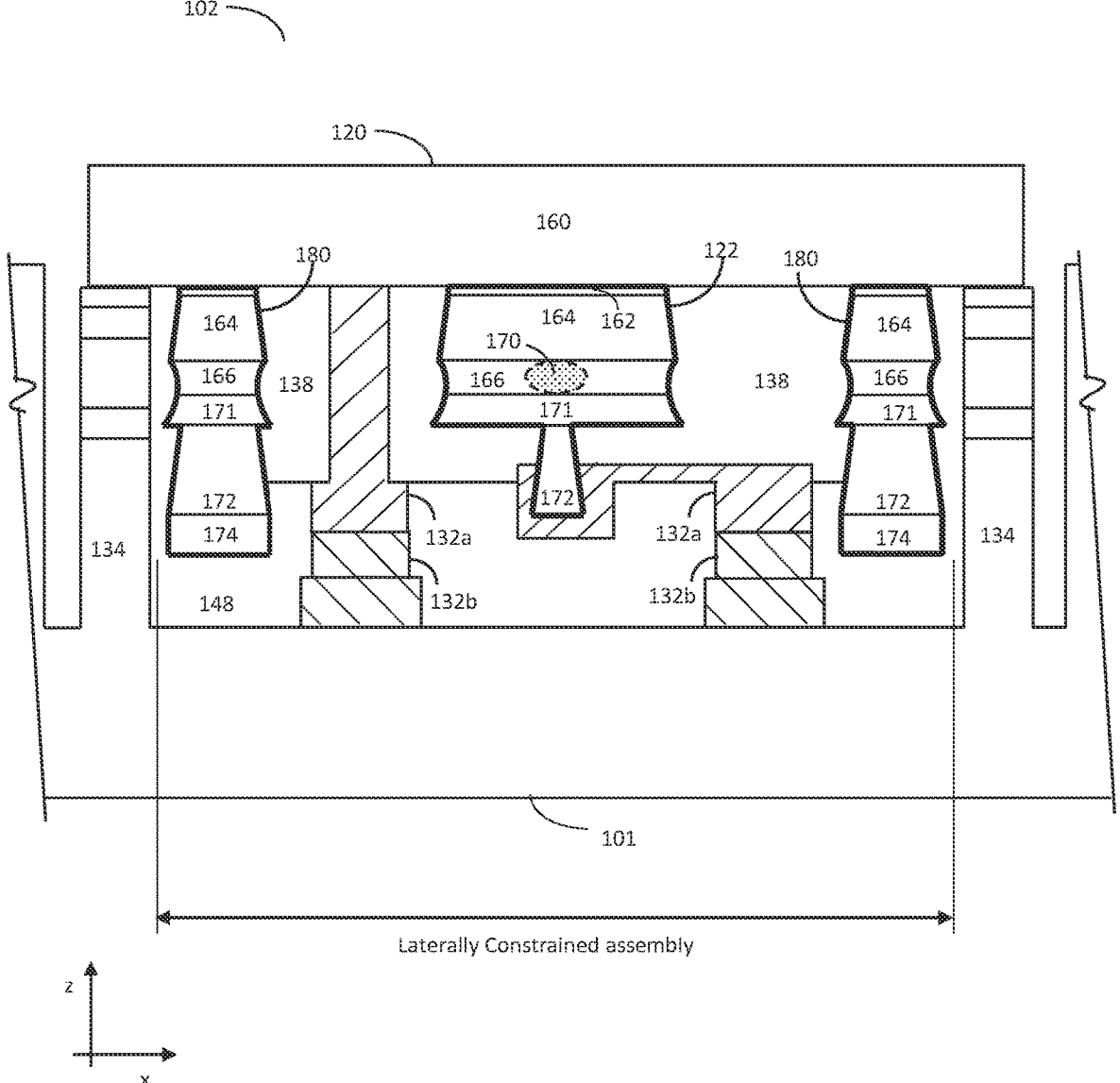
FIG. 1A shows a cross sectional view of an embodiment of a ridge waveguide laser die with alignment aids on an interposer substrate that includes complementary alignment aids.

Various embodiments, of the present invention will be described more fully herein with reference to the accompanying drawings. This invention may be, however, embodied in many different forms and should not be construed as limited to the embodiments described herein but rather that the embodiments described are intended to convey the scope of the invention to those skilled in the art. Accordingly, the present invention is not limited to the relative sizes and spacings illustrated in the accompanying figures. It should be understood that a "layer" as referenced herein may include a single material layer or a plurality of layers. For example, an "insulating layer" may include a single layer of a specific dielectric material such as silicon dioxide, or may include a plurality of layers such as one or more layers of silicon dioxide and one or more other layers such as silicon nitride, aluminum nitride, among others. The term "insulating layer" in this example, refers to the functional characteristic layer provided for the purpose of providing the insulation property, and is not limited as such to a single layer of a specific material. Similarly, an electrical interconnect layer, as used herein, refers to a composite layer that includes both the electrically conductive materials for transmitting electrical signals and the intermetal and other layers required to insulate the electrically conductive materials. An electrical interconnect layer may include a patterned layer of electrically conducting material such as copper or aluminum as well as an intermetal dielectric material such as silicon dioxide, and spacer layers above and below the electrically conductive materials, for example, among other layers. Additionally, references herein to a layer formed "on" a substrate or other layer may refer to the layer formed directly on the substrate or other layer or on an intervening layer or layers formed on the substrate or other layer. Like numbers in drawings refer to like elements throughout, and the various layers and regions illustrated in the figures are illustrated schematically.

Optical features of optoelectrical die that require alignment with mating features on an interposer substrate can include, for example, emitting facets of an optoelectrical device such as a laser, or a portion of a photodiode that receives an optical signal for detection. These features of optoelectrical die can be aligned, for example, with features on an interposer that can include planar waveguides and other optical devices formed on the interposer-based PIC substrate. Alignment of the features of mounted optoelectrical die with features on the interposer facilitates the efficient transfer of optical signals, for example.

The use of complementary mechanical alignment features formed on both mounted optoelectrical die and on interposer substrates to which these die are mounted, in embodiments, are particularly beneficial for providing alignment within the lateral plane of the substrate, herein referred to and referenced as alignment in the "x" and "y" directions. In embodiments, lateral "x" and "y" alignment features on optoelectrical die are concurrently formed with ridge waveguide laser pedestals using fabrication steps that include lithographic patterning in combination with suitable subsequent etch patterning processes. Concurrent formation of the ridge waveguide laser pedestal and the alignment aids provides a degree of precision in the measure of the spacing between the optically emitting facet of the laser and the alignment aid that is within the range of precision provided by the lithographic technique. Lithographic patterning can be highly precise and can easily produce spacing tolerances of less than a micrometer. More advanced lithographic technology, although costly to implement, can produce spacing tolerances on the order of ten nanometers. This degree of precision is not typically required for the formation of the lasers and associated alignment aids described herein due to other tolerance limitations as described herein. Complementary-shaped features formed on the interposer, to those alignment aids formed on the optoelectrical die that are intended to be mounted on the interposer, are also patterned using lithographic patterning techniques.

In some embodiments, mechanical alignment aids are formed in the shape of a triangular cavity on an optoelectrical die and in the shape of complementary pillar on interposer-based PIC substrates that are compatible with the mechanical alignment aids on the optoelectrical die. As further described herein, these complementary-shaped triangular pillars and cavities are configured to laterally guide the movement of the optoelectrical or optical die and enable the alignment of optoelectrical, optical, or electrical features on the die with optical or other features on the interposer. In these embodiments, during an assembly process, the triangular-shaped cavity features on the optoelectrical or optical die are firstly placed over the triangular pillars of the interposer, and secondly, once placed, the compatibly shaped features on the interposer and the die allow for the optoelectrical die to be guided into place on the interposer. As the triangular features are brought into alignment in these embodiments, the optical facets or other features of the optoelectrical or optical die are brought into lateral alignment with the optoelectrical or optical facets or other features on the interposer. The vertical alignment of these features is established, in embodiments, with a reference surface on the optoelectrical or optical die that is brought into contact with the top of the alignment reference pillars on the interposer. In addition to the optical features that are brought into alignment in these embodiments, electrical contacts between the interposer and the mating optoelectrical die can also be brought into alignment or used to facilitate the alignment process. Intentionally misaligned solder connections at placement, as encountered for example in some embodiments, are used to exert a force on the optoelectrical die upon the application of a heat source. The exerted force on the placed die upon heating will act to move the misaligned solder connections into areal alignment and the alignment features will guide the moving die into a preferred lateral alignment position on the interposer as described herein.

In other embodiments, non-triangular-shaped pillars are formed on an interposer, and complementarily-shaped cavity features are formed on optoelectrical or optical die that facilitate the positioning of these die onto the interposer and that further facilitate and enable the alignment of optoelectrical, optical, and electrical features on the die with features on the interposer. In these embodiments, alignment pillars that are semi-circular, trapezoidal, hexagonal, or any of a wide number of shapes or combination of shapes are formed on the interposer and complementary-shaped cavity features are formed on the optoelectrical or optical die that allow for the alignment of the features formed on these die with alignment reference pillars formed on the interposer. These and other aspects and examples of embodiments are further described herein.

In FIG. 1A, a schematic cross-sectional drawing of a portion of a photonic integrated circuit (PIC) assembly 102 is shown that includes an optoelectrical die 120 and an interposer 101. The optoelectrical die 120 in FIG. 1A shows an embodiment of a ridge waveguide laser pedestal 122 and alignment aids 180 that facilitate the alignment of the laser die 120 onto the interposer 101. For clarity, in the embodiment shown in FIG. 1A, the outlines of the laser pedestal 122 and the alignment aids 180 are shown with a bold linewidth. The laser pedestal, as used herein, refers to the portion of the laser die that includes the light emitting layer for the laser diode and the other semiconductor layers of the diode structure required for the laser diode as distinguished from the alignment aids. The alignment aids, formed from the same layers as the laser pedestal, are not required for functionality of the laser diode, but rather are included on the die to facilitate alignment of the optoelectrical die that contain the laser pedestal to an interposer. Other layers, such as metallization layers, are required for operation of the laser diode but are not required in the formation of the alignment aids 180.

In the embodiment shown in FIG. 1A, alignment features 180 on the optoelectrical laser die 120 are positioned within alignment features 134 in the cavity 148 of the interposer 101. The interposer 101 is a device structure that can include a substrate, electrical interconnects, optical waveguides, and electrical and optical devices, among other features and structures, as further described herein. The alignment features 180 of the optoelectrical die 120, nested within the alignment pillars 134 of the interposer 101 in the embodiment shown, provide a laterally constrained assembly in the "+x" and "−x"-directions as referenced by the coordinates shown below the assembly 102 in FIG. 1A. In the vertical direction, or "z"-direction as referenced, the substrate 160 of the optoelectrical die 120 forms a contact with the top of the interposer alignment pillar 134 as shown.

In the embodiment shown in FIG. 1A, the laser pedestal 122 and the alignment features 180 of the optoelectrical die 120 include substrate 160, optional etch stop layer 162, and a stack of semiconductor layers that include semiconductor layer 164, one or more QW-containing layers 166, grating layer 171, and ridge waveguide layer 172. A hard mask layer 174 is also shown on alignment feature 180. Optical signal 170 is emitted from the one or more quantum wells layers 166 of the ridge waveguide laser structure during activation of the laser device in this embodiment. In some embodiments, the QW-containing layer may contain one or more graded index layers. Concurrent formation of the laser pedestal 122 and the alignment features 180 is further described herein.

Positioning of the alignment features 180 of the optoelectrical die 120 within the cavity 148 and in proximity to the alignment features 134 of the interposer 101 can facilitate alignment of optical and electrical features on the die 120 with one or more features of the interposer 101. Aligned features can include, for example, the metallization pad 132a of the die 120 with the metallization pad 132b of the interposer 101 and can include the alignment of the emitting facet from the emissive layers 166 of the laser pedestal 122, for example, with waveguides or other optical or optoelectrical devices on the interposer 101 for efficient coupling of the emitted signal 170 from the laser pedestal 122 to a waveguide or other optical device on the interposer 101.

Figure 1B:
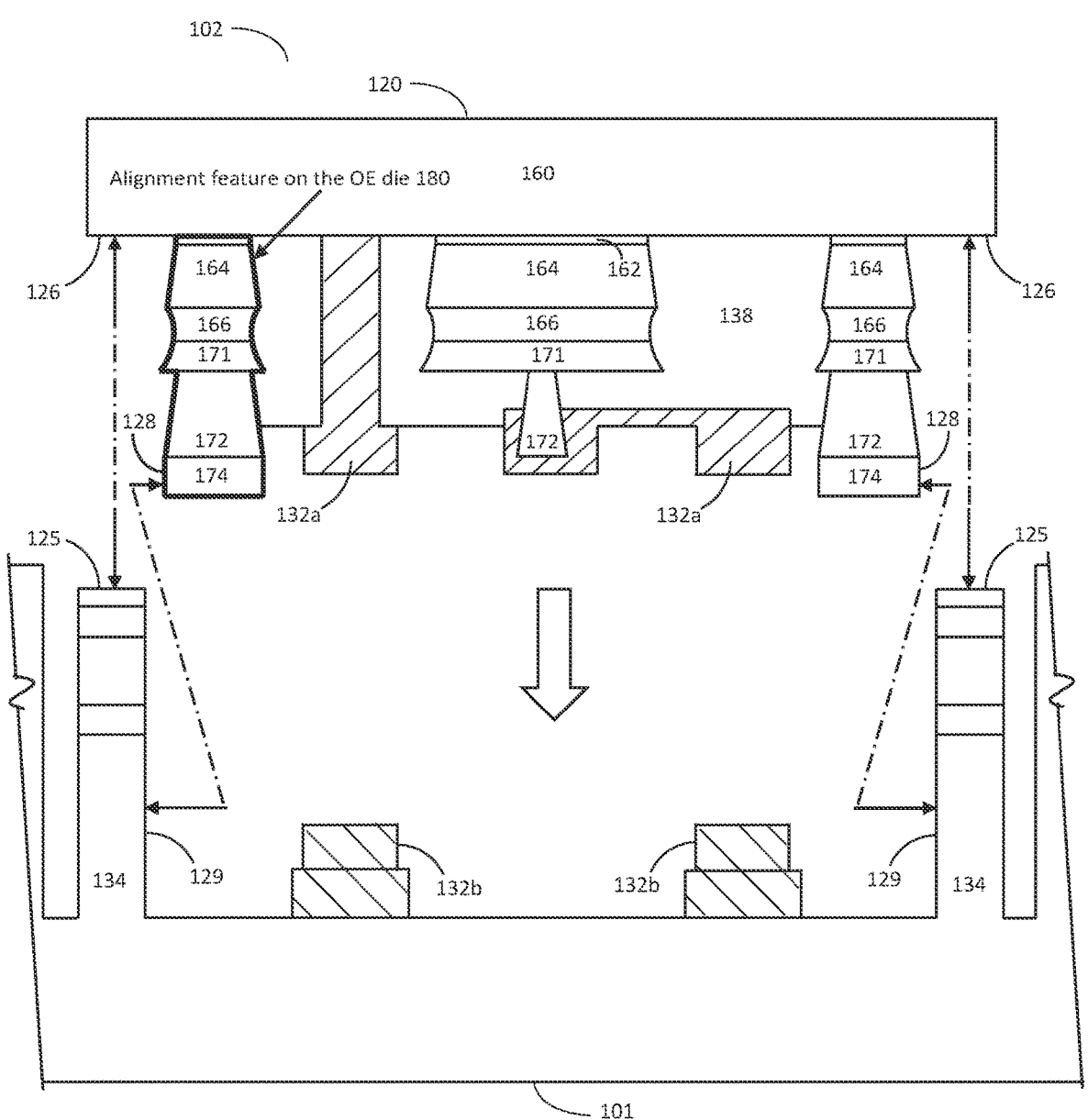
FIG. 1B shows an exploded cross-sectional view of the embodiment of the ridge waveguide laser die with alignment aids and interposer substrate from FIG. 1A.

Referring to FIG. 1B, an exploded schematic cross-sectional drawing of the portion of PIC 102 of FIG. 1A is shown. In the embodiment, alignment features of the optoelectrical die 120 can form a contact with alignment features of the interposer 101 that restricts the movement of the optoelectrical die 120 within the cavity 148 of the interposer 101.

In the embodiment shown in FIG. 1B, one or more horizontal surfaces 126 are provided on the substrate 160 of the optoelectrical die 120 and these horizontal surfaces 126 form contacts with one or more top horizontal surfaces 125 of alignment pillars 134 of the interposer 101. Vertical alignment between the optoelectrical die 120 and the interposer 101, and the device structures thereon, can result from the formation of these contacts between the horizontal surfaces 126 of the optoelectrical die 120 and the top surfaces 125 of the alignment pillars 134.

One or more vertical surfaces 128 of the alignment feature 180 of the optoelectrical die 120 and the one or more vertical surfaces 129 of the alignment pillars 134 of the interposer 101 are also shown in FIG. 1B. The vertical surfaces 128 of the one or more alignment features 180 of the optoelectrical die 120 restrict the lateral movement of the optoelectrical die 120 within the cavity 148 of the interposer 101 upon formation of a contact with a vertical surface 129 of the alignment feature 134 formed within the cavity 148 of the interposer 101. The optoelectrical die 120 is free to move laterally within the cavity 148 of the interposer 101 until contact is made between a vertical surface 128 of one or more alignment pillars 180 with one or more vertical surfaces 129 of an alignment pillar 134. The alignment surfaces 128, 129 provide a limit to the range of lateral movement of the optoelectrical die 120 within the cavity 148.

In an example embodiment of the assembly 102, a contact is formed between one or more vertical alignment surfaces 128 of an alignment feature 180 of the optoelectrical die 120 and one or more vertical alignment surfaces 129 of an alignment feature 134 of the interposer 101. In another example embodiment of the assembly 102, the alignment features 180 of the optoelectrical die 120 are positioned to restrict the movement of the die 120 on the interposer 101 but no contact is formed between the one or more vertical alignment surfaces 128 of the alignment feature 180 of the optoelectrical die 120 and the one or more vertical alignment surfaces 129 of the alignment features 134 of the interposer 101. Contact between the vertical surfaces 128 of the optoelectrical die 120 and the vertical surfaces 129 of the interposer is not required in some embodiments but rather these alignment aids can restrict the movement to within a limited range of positions as required for the achieving coupling between optical features on the mounted device 120 with optical features on the interposer 101, for example.

The embodiment of the optoelectrical die 120 shown in FIG. 1A and FIG. 1B includes metallization 132*a*. Metallization pads 132*a* provide electrical contacts to the laser pedestal 122. The alignment of metallization features 132*a* of the optoelectrical die 120 and metallization features 132*b* of the interposer, shown in FIG. 1A and FIG. 1B, is aided by the alignment features 134,180 of the optoelectrical die 120 and interposer 101, respectively. Additionally, the alignment features 134, 180 further facilitate the alignment of the portion of the laser pedestal 122 from which optical signal 170 is generated, with the portion of the interposer 101 to which the optical signal 170 is coupled. The alignment of the portion of the laser pedestal 122 from which the optical signal 170 is generated with the portion of the interposer 101 to which the optical signal 170 is received or otherwise coupled can require a more precise alignment than that required for the alignment of the metallization layers 132*a*, 132*b*. Other features in the assembly 102 may also benefit from the restricted range of movement provided by the alignment features 180 of the optoelectrical die 120 and the alignment pillars 134 on the interposer 101.

It should be noted that the contact with the vertical alignment surface 128 of the alignment feature 180 need not be positioned at the top of the alignment feature 180 as shown in FIG. 1B and the contact location with the alignment pillar 134 of the interposer 101 need not be at the lower portion of the pillar 134 as shown. Irregularities in the surfaces of the alignment features 180 of the optoelectrical die 120 are to be anticipated in some embodiments that result from the formation of the alignment features 180. Irregularities from isotropic wet etch processes, for example, can be used in the patterning of one or more of the layers in the laser pedestal 122 and alignment aid 180 structures. The roughness of vertical surface 128 shown in FIG. 1B is representative of the way in which an alignment pillar 180 may appear in practice after formation using, for example, one or more wet chemical etches, one or more dry etches, or a combination of one or more wet chemical and dry etch processes. Layers in the film structure used to form the laser and the alignment aids have differing etch properties, and these differing etch properties can lead to the roughness such as that shown in FIGS. 1A-1C. Side surface 128, therefore, can be a point, can be a portion of the overall side surface, or can be the entire side surface.

Optoelectrical die 120 may be positioned onto interposer 101 using an automated or non-automated pick and place apparatus. The placement tolerance for an advanced pick and place apparatus using in semiconductor manufacturing can be as low as 0.3 microns, for example. This placement tolerance is the minimum spacing between the side surface 128 of alignment pillar 180 and a vertical surface 129 of the interposer. In an assembly that includes a rough surface due to the fabrication processes used in the formation of an embodiment of the alignment pillars 180, the minimum placement tolerance may be, for example, the spacing between the outward-most protrusion from the surface of the sidewall 128 of the alignment aid 180 and the outward-most protrusion of the alignment aid 134 on interposer 101. In practice, the placement tolerance for a pick and place apparatus may be greater than 0.3 microns. In less advanced pick and place apparatus, the placement for a pick and place apparatus may be greater than 0.5 microns. These values for placement apparatus are provided for reference, and actual placement tolerances may differ yet remain within the scope of embodiments.

Figure 1C:
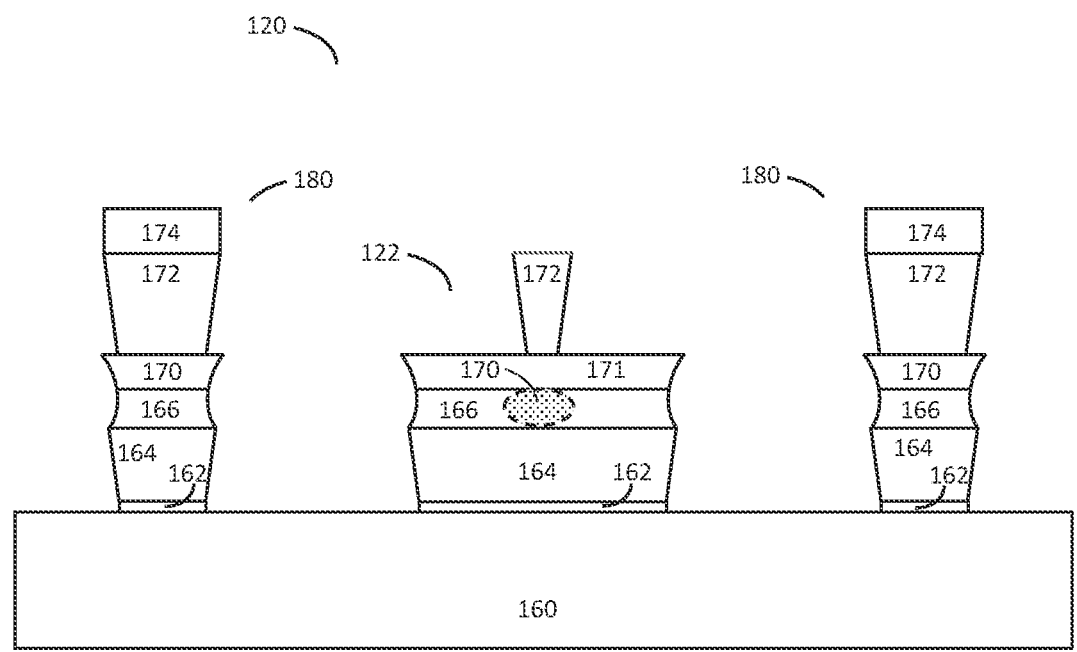
FIG. 1C shows a cross-sectional view of an embodiment of a ridge waveguide laser die with mechanical alignment aids shown without the metallization layers (fabricated using the process flow described herein.)

Referring to FIG. 1C, a schematic cross-sectional drawing of a portion of an embodiment of optoelectrical die 120 with alignment aids 180 is shown. The portion of the embodiment in FIG. 1C is shown without the metallization layer 132*a* or the dielectric layer 138 that was included in FIGS. 1A and 1B. The optoelectronic die 120 shown in FIGS. 1A-1C includes the laser pedestal structure 122 and two alignment aids 180. The laser pedestal 122 and the alignment aids 180 shown in the embodiment in FIGS. 1A-1C are formed on substrate 160 from a stack of films that includes an optional etch stop layer 162, a semiconductor layer 164, a QW-containing layer 166, a grating layer 171, and a ridge waveguide layer 172. A hard mask layer 174 is also shown on alignment feature 180. In embodiments, the laser structure and the alignment aids are formed concurrently using the common layers shown in both the laser pedestal 122 and the alignment aids 180 as illustrated in FIGS. 1A-1C. These layers and the method of coincident fabrication of the laser pedestal structure 122 and the alignment aids 180 from these layers are further described herein. In a preferred embodiment, layer 166 includes light emitting quantum well layers.

Optical radiation is emitted from the edge facet from the layer 166 as indicated by optical signal 170 shown in FIG. 1C. The optical signal 170, emitted during operation of the laser diode formed in part from the laser pedestal 122, shows an approximate area of an example laser diode to which optical devices such as a waveguide on the interposer are aligned in assemblies that include the laser die 120 and a waveguide or other optical feature on interposer 101.

In FIGS. 2A and 2B, simplified schematic drawings for embodiments that include alignment elements of FIGS. 1A-1C are shown. FIG. 2A(i) shows a schematic drawing of an embodiment of PIC assembly 202 that includes the optoelectrical die 220 and interposer 201. FIG. 2A(ii) shows an exploded view of the embodiment shown in FIG. 2A(i). The optoelectronic die 220, in the embodiment shown in FIGS. 2A(i) and 2A(ii), includes laser pedestal 222 and alignment features 280. The laser pedestal 222 further includes an emission layer from which optical signal 270 is emitted during operation. The spacing between the alignment aids 280 and the laser pedestal 222 is precisely determined as a result of using the same lithographic patterning processes to define the patterned mask layer from which the underlying layers are etched or otherwise patterned. Precise alignment of the laser pedestal 222 with the alignment aid 280, as further described herein, enables the alignment of the emission facet of the laser pedestal 222 and when activated, emitted optical signal 270, with specific features or devices of the interposer 201. The emitted signal 270 from the laser pedestal 222, in some embodiments, for example, can be directed to a waveguide on the interposer 201 for further routing of this signal 270 in waveguides or other optical devices or optical circuit elements on the interposer 201. In other embodiments, the alignment of one or more features, devices, and structures, or a portion of one or more features, devices, and structures may be provided using embodiments described herein.

The interposer 201, as shown in the embodiment in FIGS. 2A(i) and 2A(ii), has complementary alignment features 234 to those of the optoelectrical die 220. PIC assembly 202 in FIG. 2A(i) shows a laterally constrained optoelectrical die 220, as noted on the figure, within the cavity 248 of the interposer 201 resulting from the inclusion of the alignment aids 280 on the optoelectronic die 220 and the alignment aids 234 on the interposer 201. Lateral movement of the optoelectronic die 220 is limited to the difference between the maximum outside dimension of the alignment aids 280 and the spacing between the alignment pillars 234 on the interposer as noted on FIG. 2A(ii). Sufficient allowance must be made for the placement tolerance of the die placement device to place the alignment aids 280 within the spacing provided between the interposer alignment pillars 234. Typical tolerances of automated pick and place die placement equipment is on the order of a few microns or less. Placement tolerances for advanced pick and place apparatuses can be as little as 0.3 microns.

In the embodiment shown in FIGS. 2A(i) and 2A(ii), the alignment aids 280 are positioned within the alignment pillars 234 of the optoelectronic die 220 with spacing 281. Spacing 281 is at a minimum distance, in embodiments, when a contact is formed between the alignment aid 280 of the optoelectrical die 220 and the alignment pillar 234 of the interposer 201. Conversely, the spacing 281 is at a maximum, or near maximum, when a contact is made between an alignment aid 280 and alignment pillar 234 on the other side of the die 220. In FIG. 2A(i), for example, the maximum spacing for the alignment aid 280 and the alignment pillar 234 at the right portion of the assembly 202 occurs when the alignment aid 280 is in contact with the alignment pillar 234 at the left portion of the assembly 202 of FIG. 2A(i). The limitation in the range of movement between the alignment aids 280 of the optoelectrical die 220 and the alignment pillars 234 of the interposer 201, in embodiments, limits the range of positions available for the laser pedestal 222. By limiting the range of positions available for the laser pedestal 222 on the interposer 201, the range of lateral positions to which an optical signal 270 from the laser pedestal 222 can substantially be transferred or otherwise coupled to a device or structure on the interposer 201 to which the emission facet of the laser pedestal 222 is aligned is also limited.

Movement in the vertical direction (as noted in FIG. 2A(i)) is constrained in the embodiment shown in FIG. 2A(i) by the contact between the top of one or more alignment pillars 234 on the interposer 201 and the surface of the substrate 260 to which a contact is formed between the optoelectronic die 220 and the interposer 201. A horizontal surface 226 on the optoelectronic die 220 is shown in the exploded view of FIG. 2A(ii), and in the embodiment shown in this figure, horizontal surface 226 forms a contact with top horizontal surface 225 of the alignment pillar 234 of the interposer 201. In embodiments, the formation of a contact between one or more horizontal surfaces 226 on the optoelectronic die 220 with one or more horizontal surfaces 225 on one or more alignment pillars 234 on the interposer 201 restricts the vertical movement of the die 220 on the interposer 201 and establishes the vertical alignment of the light emitting layer, and hence the optical signal 270, from the laser pedestal 222 with an optical device on the interposer 201.

Lateral constraints to limit the movement of the optoelectronic die 220 within the cavity 248 results from at least a portion of the vertical surface 228 of the alignment aid 280 of the optoelectronic die 220 forming a contact with at least a portion of the vertical surface 229 of the alignment pillar 234 of the interposer 201. Formation of a contact between vertical surface 228 on the die 220 and vertical surface 229 on the interposer limits any further lateral movement of the optoelectronic die 220. On rough surfaces, the contact may be a point on the vertical surface 228.

When a contact is formed between vertical surface 228 of the optoelectrical die 220 and the vertical surface 229 of the interposer 201, the resulting range of allowable positions for the optoelectronic die 220 on the interposer 201 is limited to the difference between the inside spacing of the alignment pillars 234 and the alignment aid maximum outside dimension as noted on FIG. 2A(ii). Adequate spacing 281 is provided in embodiments to accommodate placement of the optoelectronic die 220 between the alignment pillars 234. The maximum spacing, however, is limited in some embodiments such that the optical signal 270 emitted from the laser pedestal 222 is in substantial alignment with the mating device or structure on the interposer 201.

Optoelectronic die 220 may be subjected to movement during positioning and alignment of the die 220 with one or more portions of the interposer 201 and bonded into place after alignment using the metallization contacts or other means. Other means for bonding the optoelectrical device into place can include epoxy. Other forms of adhesive materials may also be used.

Referring to FIG. 2B(i), a schematic drawing is shown of an example of another embodiment of the alignment features of the PIC assembly 202 in which the alignment pillars 234 of the interposer 201 are aligned to form a contact with the interior surface of the alignment features 280 of the optoelectronic die 220 as shown. The example embodiment shown in FIG. 2B(i) provides another example of the positioning of alignment aids 280 and the complementary alignment pillars 234 on the interposer 201 to provide lateral constraints that limit the movement of the optoelectrical die 220 within the interposer cavity 248.

FIG. 2B(i) shows a schematic drawing of an embodiment of PIC assembly 202 that includes the optoelectrical die 220 and interposer 201. In the embodiment shown in FIGS. 2B(i) and 2B(ii), the optoelectronic die 220 includes laser pedestal 222 and alignment features 280. The laser pedestal 222 includes an emission layer from which optical signal 270 is emitted during operation. The spacing between the alignment aids 280 and the emission facet of the laser pedestal 222 is precisely determined as a result of using the same lithographic patterning processes to define the laser pedestal 222 and the alignment features 280. Precise alignment of the laser pedestal 222 with the alignment aid 280, as further described herein, enables the precise alignment of emitted signals 270 from the laser pedestal 222 with specific portions of the interposer 201 during operation of the laser. Emitted signal 270, in some embodiments, for example, can be directed to a waveguide on the interposer 201 for further routing of this signal 270 on the interposer 201. In other embodiments, the emitted signal 270 may be aligned with an optical or optoelectrical device, for example, on the interposer 201. In yet other embodiments, the alignment of one or more features, devices, and structures, or a portion of one or more features, devices, and structures may be provided using embodiments described herein.

The optoelectrical die 220 has alignment features 280 and the interposer 201 has complementary alignment features 234. PIC assembly 202 in FIG. 2B(i) shows a laterally constrained optoelectrical die 220, as noted on the figure, within the cavity 248 of the interposer 201 resulting from the inclusion of the alignment aids 280 on the optoelectronic die 220 and the alignment pillars 234 on the interposer 201. Lateral movement of the optoelectronic die 220 is limited to the difference between the interior spacing of the alignment aids 280 on the optoelectronic die 220 and the alignment pillar maximum outside dimension for the alignment pillars 234 on the interposer 201. In the embodiment shown in FIGS. 2B(i) and 2B(ii), the alignment pillars 234 are positioned within the alignment features 280 of the optoelectronic die 220 with spacing 281. Spacing 281 is at a minimum distance, in embodiments, when a contact is formed between the alignment aid 280 of the optoelectrical die 220 and the alignment pillar 234 of the interposer 201. Conversely, the spacing 281 is at a maximum, or near maximum, when a contact is made between an alignment aid 280 and alignment pillar 234 on the other side of the die 220. In FIG. 2B(i), for example, the maximum spacing for the alignment aid 280 and the alignment pillar 234 at the right portion of the assembly 202 occurs when the alignment aid 280 is in contact with the alignment pillar 234 at the left portion of the assembly 202 of FIG. 2B(i). The limitation in the range of movement between the alignment aids 280 of the optoelectrical die 220 and the alignment pillars 234 of the interposer 201, in embodiments, limits the range of positions available for the laser pedestal 222 and the range of lateral positioning to which the optical signal 270 provides substantial transmission of the optical signal 270 from the laser pedestal 222 and the device or structure on the interposer 201 with which the optical signal 270 is aligned.

Movement in the vertical direction is constrained in the embodiment shown in FIG. 2B(i) by the contact between the top surface 225 of the alignment pillars 234 on the interposer

201 and the horizontal surface 226 of the substrate 260 to which a contact is formed between the optoelectronic die 220 and the interposer 201. Horizontal surface 226 on the optoelectronic die 220 is shown in the exploded view of FIG. 2B(ii), and in the embodiment shown in this figure, horizontal surface 226 forms a contact with the top surface 225 of an alignment pillar 234 on the interposer 201. In embodiments, the formation of a contact between one or more horizontal surfaces 226 on the optoelectronic die 220 with one or more horizontal surfaces 225 on one or more alignment pillars 234 on the interposer 201 restricts the vertical movement of the die 220 on the interposer 201. Lateral constraints to limit the movement of the optoelectronic die 220 within the cavity 248 results from at least a portion of the vertical surface 228 of the alignment aid 280 of the optoelectronic die 220 forming a contact with at least a portion of the vertical surface 229 of the alignment pillar 234 of the interposer 201. Formation of a contact between vertical surface 228 and vertical surface 229 limits any further lateral movement of the optoelectronic die 220. The resulting range of allowable positions for the optoelectronic die 220 on the interposer 201 is limited to the difference between the inside spacing of the alignment aids 280 and the alignment pillar maximum outside dimension as noted on FIG. 2B(ii). Adequate spacing 281 is provided in similar embodiments as shown in FIGS. 2B(i) and 2B(ii) to accommodate positioning of the alignment pillars 234 of the interposer 201 between the alignment aids 280 of the optoelectronic die 220. The maximum spacing, however, is limited in some embodiments such that the optical signal 270 is in substantial alignment with the mating device or structure on the interposer as determined by the functionality of the PIC 202 over the full available range of spacing 281.

Optoelectronic die 220 may be subjected to movement during positioning and alignment of the die 220 with one or more portions of the interposer 201 and bonded into place after alignment using the metallization contacts or other means.

The embodiment shown in FIGS. 2B(i) and 2B(ii) illustrates an embodiment with an alternate configuration for the alignment features 280 and alignment pillars 234 for restricting the lateral movement of the optoelectrical die 220 within the interposer cavity 248 and facilitating precise alignment of an output signal 270 from the laser pedestal 222 to a waveguide, optical device, or other functional element on the interposer 201. A number of other example embodiments are further described herein that include aspects of embodiments not provided in the cross sections shown in FIGS. 1A-1C and FIGS. 2A-2B as these drawings have been limited to a single cross section. FIGS. 1A-1C and FIGS. 2A-2B show simplified schematics that illustrate and describe key elements of the embodiments. In other embodiments, other contact surfaces can be provided in different locations than those provided in FIGS. 1A-1C and FIGS. 2A-2B. Additionally, the alignment aids 280 on the optoelectrical die 220 can be formed with a variety of shapes and locations on the optoelectrical die 220 and the alignment pillars 234 on the interposer 201 can be formed with a variety of shapes and locations on the interposer as described further herein and remain within the scope of embodiments. Additional functionality can also be provided in these additional embodiments to improve the alignment process for the optoelectrical die 220 on the interposer 201 as described herein.

In the following section, the method of fabrication of the embodiments of the optoelectrical die 220 with the laser pedestal 222 and the alignment aids 280 is provided. A simplified description of the method of fabrication of the embodiments is provided in FIG. 3 and schematic drawings that illustrate each of the individual steps in embodiments of the method of fabrication are provided in FIG. 4.

FIG. 3. shows a flow chart for forming optoelectrical die that include at least one ridge waveguide laser feature and one or more alignment aids according to some embodiments. The flow chart of FIG. 3 is described in conjunction with the cross-sectional schematic drawings in the embodiments shown in FIGS. 4A-4B that further illustrate an example process for forming an optoelectronic die that includes a laser feature and two alignment aids according to some embodiments. In other embodiments, other quantities of laser features and alignment aids can be used.

Step 390 of process flow 310 is a forming step in which a substrate is formed having an optional etch stop layer. Step 392 of process flow 310 is a forming step in which a stack of semiconductor layers for a ridge waveguide laser is formed with an optional second etch stop layer below the ridge waveguide layer. Step 393 of process flow 310 is a forming step in which a first patterned mask layer is formed on the stack of semiconductor layers. Step 394 of process flow 310 is a pattering step in which a first portion of the stack of semiconductor layers is patterned to form all or a portion of the ridge waveguide and to form the top portion of one or more mechanical alignment aids. The patterning of the first portion of the stack of semiconductor layers may be stopped on the optional etch stop layer if present. Step 395 is a forming step in which a second patterned mask layer is formed over the ridge waveguide. Step 396 of process flow 310 is a patterning step in which a second portion of the semiconductor stack is patterned to form a bottom portion of the ridge waveguide laser diode and a bottom portion of the mechanical alignment aids. The patterning of the second portion of the stack of semiconductor layers may be stopped on the optional first etch stop layer, if present. Steps 390 through 396 are further described in conjunction with the drawings provided in FIGS. 4A and 4B. Step 397 is a continuing step in which processing for the formation of the optoelectrical die subsequent to the second patterning step is continued.

Referring to FIG. 4A(i), a schematic drawing of a substrate 460 is shown corresponding to the substrate forming step, Step 390, of FIG. 3. In some embodiments, the substrate 460 may be semiconductor such as InP. GaAs or other semiconductor substrates can also be used. In other embodiments, other ceramic or metal substrates can be used. In yet other embodiments, structures consisting of one or more layers of a semiconductor, ceramic, or metal substrate is used to form the substrate 460. In a preferred embodiment, the substrate allows for epitaxial crystalline growth of the semiconductor layers in the laser structure. Also shown in FIG. 4A(i) on substrate 460 is optional first etch stop layer 462.

Referring to FIG. 4A(ii), a schematic drawing of a substrate 460 is shown with optional first etch stop layer 462 and a stack of semiconductor layers 475 for a ridge waveguide laser and formed with an optional second etch stop layer 469 below the ridge waveguide layer 472 corresponding to the forming step for the semiconductor layers, Step 392, of FIG. 3. In Step 392, the stack of semiconductor layers is formed. The stack of semiconductor layers 475 includes a stack of layers required to form the n-doped and p-doped layers necessary to form the p-n junction laser diode structure and that includes a light emitting layer. In an example embodiment, the layer 464 at the bottom of the stack of semiconductor layers 475, as shown in the FIG.

4A(ii), is an n-doped InP layer 464 and may include a heavily doped n-type contact layer. Additionally, the stack of semiconductor layers 475 includes one or more quantum well layers 466 that form all or a portion of the light emitting layers of the laser. Above the light emission layer is a grating layer 471, that may include a second etch stop layer, and the ridge waveguide layer 472. In the example embodiment, the ridge waveguide layer is a p-doped layer that can include a heavily doped p-type contact layer. In the example embodiment, the ridge waveguide layer is p-type InP. In embodiments in which the optional second etch stop layer 469 is provided in the stack of layers, a p-type AlGaInAs layer can be used, for example. Other etch stop layers that provide a low etch rate in comparison to the layers above the etch stop layer can be used in other embodiments in which this optional second etch stop layer is utilized in the structure. In embodiments in which a second etch stop layer 469 is used, the etch stop layer in some embodiments resides below the ridge waveguide layer 472 and can be a grating layer or an additional layer that is not a portion of the grating layer.

Referring to FIG. 4A(iii), a schematic drawing of a substrate 460, an optional first etch stop layer 462, a stack of semiconductor layers 475, and with a patterned hard mask 474 is shown corresponding to the forming step 393 for the first patterned mask layer 474 shown in FIG. 3. The patterned hard mask layer 474 is formed on the ridge waveguide layer 472 of the structure that includes the substrate 460, the optional etch stop layer 462, and the stack of semiconductor layers 475.

Referring to FIG. 4A(iv), a schematic drawing is shown in which the patterned hard mask layer 474 has been used as an etch mask to pattern a first portion of the semiconductor stack to form all of a portion of the ridge waveguide of a laser diode and to form a top portion of one or more mechanical alignment aids, corresponding to the patterning step, Step 394, of FIG. 3. In embodiments that include an optional second etch stop layer 469, the etch process to pattern the ridge waveguide layer 472 is stopped on or near the second etch stop layer 469. In other embodiments, the etch stop does not stop directly on the etch stop layer but just below or just above the etch stop layer.

Referring to FIG. 4A(v), a schematic drawing corresponding to Step 395 of FIG. 3 is shown in which a second patterned mask layer 476 is formed over the patterned hard mask 474 and top portion of the laser ridge waveguide layer 472 and the exposed portion of either the optional second etch stop layer, if present, or other exposed layer in the stack of semiconductor layers 475, such as layer 471, for example. Openings in the patterned mask layer 474 expose the underlying stack of semiconductor layers that may include the optional second etch stop layer 469. The second patterned mask layer 476, in embodiments, provides an areal layout for the bottom portions of the laser structures and for the bottom portions of the alignment aids 480.

Referring to FIG. 4A(vi), a schematic drawing is shown in which the second patterned mask layer 476, formed over the patterned hard mask 474 and ridge waveguide layer 472, is used with a compatible wet or dry etch process as an etching or patterning mask to pattern the stack of semiconductor layers underlying the second mask layer 476 that is exposed through openings in the patterned second mask layer, and that includes all or a portion of layer 471, layer 466, and the layer 464, stopping on the optional etch stop layer 462, if present. The forming step that results in the structure shown in FIG. 4A(vi) corresponds to Step 396 of Process 310 in FIG. 3.

Following the patterning of the semiconductor layers of the laser structure as shown in FIG. 4A(vi), additional processing steps such as one or more of the removal of residual mask layers and etch stop layers, and the inclusion of metallization layers, interconnect layers, among others, can be performed on the optoelectrical die. In some embodiments, one or more of the patterned first mask layer 474, the second mask layer 476, and first etch stop layer 462 are optionally removed from the structure. In some embodiments, the first hard mask 474 and second hard mask 476 are partially removed. In some other embodiments, only the second hard mask is removed. In some other embodiments, the hard mask remains substantially in place. In the process of fabricating functional laser diodes, pathways for the electrical currents are formed in order for the diode to function with the application of an applied voltage. Numerous methods for providing electrical contact to the bottom or side of the laser diode can be implemented with the removal or partial removal of the first etch stop layer 462, particularly for embodiments in which a non-conductive first etch stop layer 462 is utilized in the structure. Additionally, numerous methods for providing electrical contact to one or more of the top and side of the ridge waveguide layer 472 can be implemented with the removal or partial removal of one or more of the first hard mask 474 and the second hard mask 476.

Figure 4B:
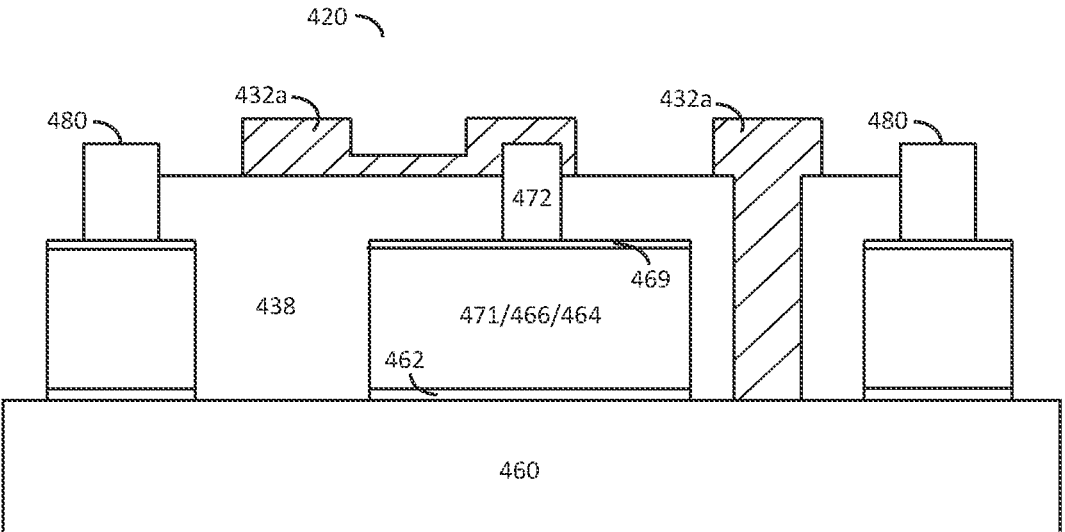
FIG. 4B shows a cross section schematic view of an example of an embodiment of an optoelectronic die with laser diode and alignment aids shown with metal contacts.

Referring to FIG. 4B, a schematic drawing is shown of an embodiment in which metal contacts 432a are formed on the optoelectrical die 420 to form electrical contacts with the top layer of the ridge waveguide 472. In the example embodiment shown, the metal contact structure includes the metallization 432a and the intermetal dielectric layer 438. Other structures and variations of the metal contact can be used in other embodiments to form the contacts.

Figure 4C:
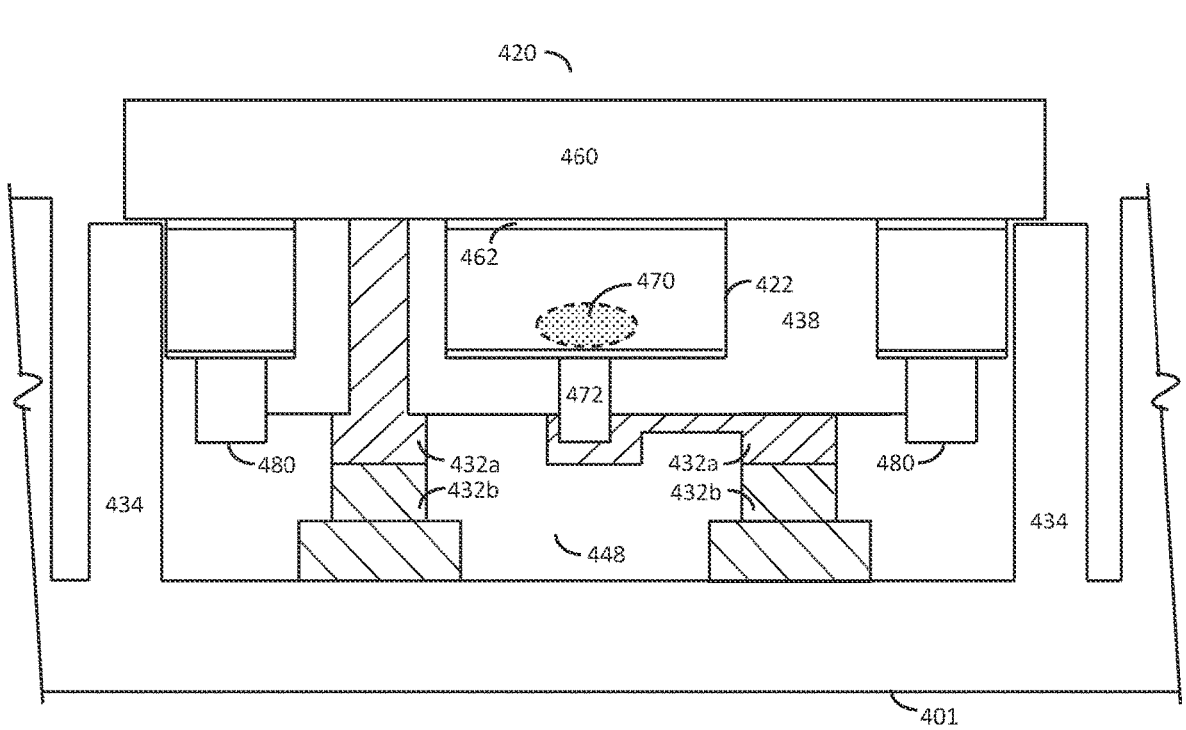
FIG. 4C shows a cross section schematic view of an example of an embodiment of an optoelectronic die and interposer assembly that includes the ridge waveguide laser with alignment aids.

Referring to FIG. 4C, a schematic drawing is shown of a PIC assembly 402 in which the embodiment of the optoelectronic die 420 shown in FIG. 4B is combined with an interposer 401. The metal contacts 432a of the optoelectronic die 402 are aligned or substantially aligned with the metal contacts 432b of the interposer 401. In the PIC assembly 402, the alignment aids that were formed concurrently with the laser pedestal 422 limit the movement of the optoelectronic die 420 within the constraints of the alignment pillars 434 of the interposer 401. The combination of the alignments aids 480 of the optoelectrical die 420 and the alignment pillars 434 of the interposer 401 ensure that the optical signal 470 emitted from the laser pedestal 422 is substantially aligned with optical features on the interposer 401 such as an optical or optoelectrical device on the interposer 401. In an example embodiment, the alignment signal 470 communicates with an optical waveguide integrated into the interposer 401. This and other alignment aspects are further described herein.

It should be noted that in the embodiment shown in FIG. 4C, the centers of the electrical contacts 432a, 432b are substantially aligned. In some embodiments, an initial misalignment of the contacts may be preferred. In some assemblies, a subsequent alignment step using surface tension of molten solder to provide movement of the die 420 into an aligned or substantially aligned position on the interposer 401 may be preferred.

Figure 5:
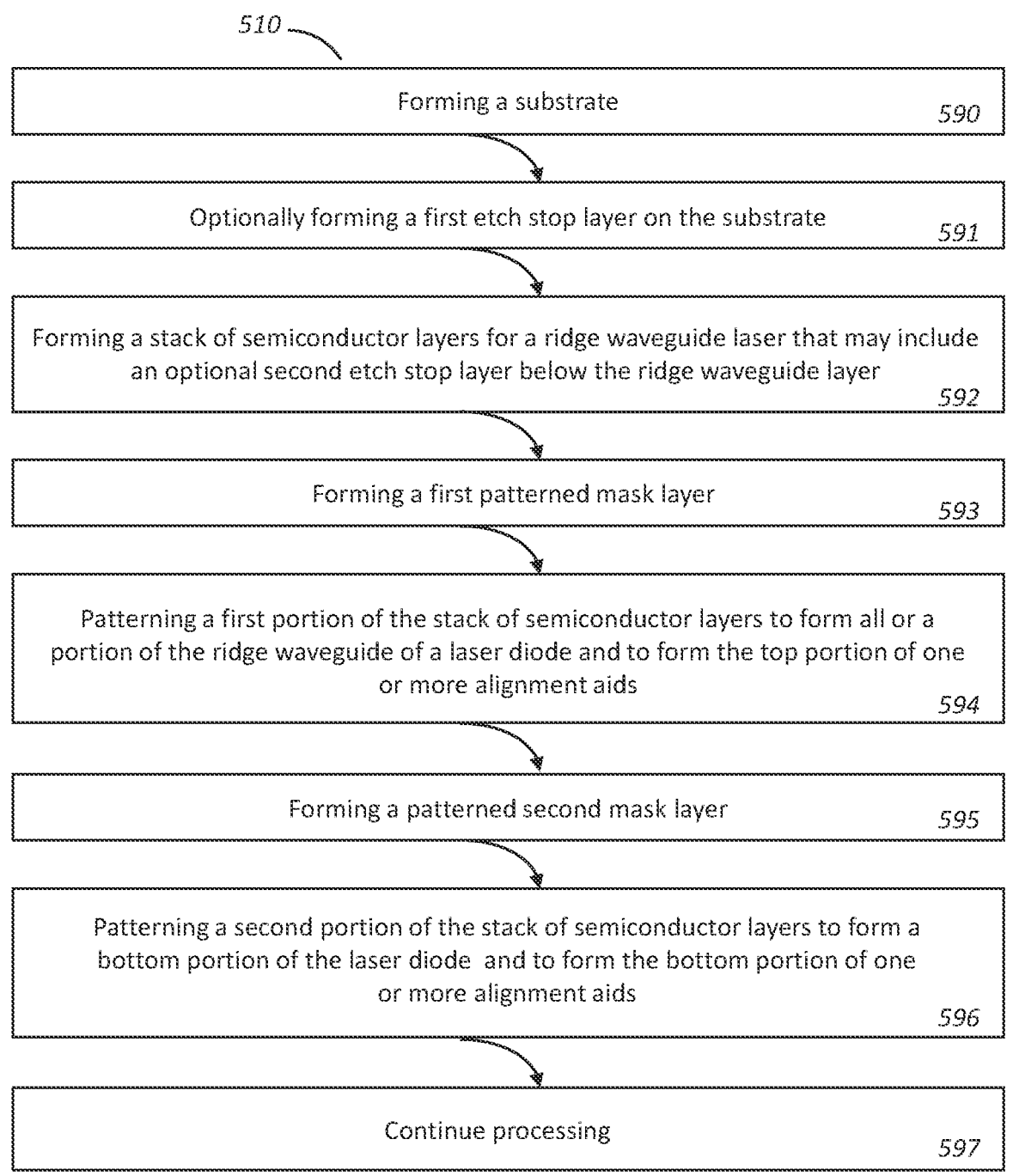
FIG. 5 shows an embodiment of a Process flow for the formation of a laser die with alignment aids FIG. 6A(i) shows a portion of the process flow of the embodiment described in FIG. 5 for the fabrication of the RWG laser optoelectrical die with mechanical alignment aids that includes the formation of a substrate.

FIG. 5. illustrates a flow chart for forming optoelectrical die that include at least one ridge waveguide laser feature and one or more alignment aids according to some embodiments. The flow chart of FIG. 5 is described in conjunction with the cross-sectional schematic drawings in the embodiments shown in FIGS. 6A-6B that further illustrate an example process for forming an optoelectronic die that includes a laser feature and two alignment aids according to some embodiments. In other embodiments, other quantities of laser features and alignment aids can be used.

Step 590 in the process flow 510, shown in FIG. 5, is a forming step in which a substrate is formed. Step 591 of process flow 510 is an optional forming step in which an optional first etch stop layer is formed on the substrate. Step 592 of process flow 510 is a forming step in which a stack of semiconductor layers for a ridge waveguide laser is formed that may include an optional second etch stop layer below the ridge waveguide layer. Step 593 of process flow 510 is a forming step in which a first patterned mask layer is formed on the stack of semiconductor layers. Step 594 of process flow 510 is a patterning step in which a first portion of the stack of semiconductor layers is etched or otherwise patterned. The first portion of the stack of semiconductor layers may include all or a portion of one or more ridge waveguides and the top portion of one or more alignment aids, and may stop on the optional second etch stop layer. Step 595 of process flow 510 is a forming step that includes the formation of a second patterned mask layer over all or a portion of the one or more ridge waveguides and the top portions of one or more alignment aids. Step 596 of process flow 510 is a patterning step in which a second portion of the stack of semiconductor layers is etched or otherwise patterned. The second portion the stack of semiconductor layers includes the remaining portions of the stack of semiconductor layers, not included in the first portion, to form bottom portions of one or more ridge waveguide laser structures and to form the bottom portions of one or more alignment aids, stopping on the optional first etch stop layer, if present. Step 597 of process flow 510 is a continuing step that includes the continuation of processing in the formation of the optoelectrical die subsequent to the second patterning step.

Referring to FIG. 6A(i), a schematic drawing of a substrate 660 is shown. The formation or providing of a substrate 660 corresponds to forming step, Step 590 of process flow 510, shown in FIG. 5. In some embodiments, the substrate 660 may be semiconductor such as InP. GaAs or other semiconductor substrates can also be used. In other embodiments, other ceramic or metal substrates can be used. In yet other embodiments, structures consisting of one or more layers of a semiconductor, ceramic, or metal substrate is used to form the substrate 660. In preferred embodiments, the substrate allows for epitaxial crystalline growth of the layers in the structure.

Referring to FIG. 6A(ii), a schematic drawing of a substrate 660 with a first etch stop layer 662 is shown. The formation of the first etch stop layer 662 on the substrate 660 corresponds to forming step, Step 591, of Process 510 shown in FIG. 5. In embodiments, the etch stop layer 662 is a layer that has a low etch rate relative to the layer or layers that are to be formed on this first etch stop layer. The etch stop layer slows or halts an etching or other form of patterning process used in the patterning of the layers above the etch stop layer. In an embodiment, for example, an etch process is used to pattern the layers above the etch stop layer 662 using etch process conditions that have a higher etch rate than that of the etch stop layer 662 so that the etch rate of the etch stop layer 662 slows or halts the etching of the structure while the unpatterned portions of the layer above are being removed.

Referring to FIG. 6A(iii), a schematic drawing of a substrate 660 and optional first etch stop layer 662 is shown with a stack of semiconductor layers 675. The formation of the stack of semiconductor layers corresponds to forming step, Step 592, of Process 510 shown in FIG. 5. The stack of semiconductor layers 675 includes a stack of layers required to form the n-doped and p-doped layers of the laser diode structure that includes a light emitting layer. In an example embodiment, the layer 664 at the bottom of the stack of semiconductor layers 675, as shown in the FIG. 6A(iii), is an n-doped InP layer 664 and may include a heavily doped n-type contact layer in locations for which an electrode is to be formed. Additionally, in embodiments, the stack of semiconductor layers 675 includes one or more quantum well layers 666 and may include one or more graded index layer that form all or a portion of the light emitting layers of the semiconductor laser structure. Above the light emission layer is a grating layer 671, that may include a second etch stop layer, and the ridge waveguide layer 672. In the example embodiment, the ridge waveguide layer is a p-doped layer that can include a heavily doped p-type contact layer. In the example embodiment, the ridge waveguide layer is p-type InP. In embodiments in which the optional second etch stop layer 669 is provided in the stack of layers, a p-type AlGaInAs layer can be used, for example. Other etch stop layers that provide a low etch rate in comparison to the layers above the etch stop layer can be used in other embodiments in which this optional second etch stop layer is utilized in the structure. In embodiments in which a second etch stop layer 669 is used, the etch stop layer in some embodiments resides below the ridge waveguide layer 672 and can be a grating layer or an additional layer that is not a portion of the grating layer.

In other embodiments, other configurations of the various layers in the laser diode may be used.

Referring to FIG. 6A(iv), a schematic drawing of a substrate 660 and optional first etch stop layer 662 with a stack of semiconductor layers 675 is shown with a first patterned hard mask 674. The formation of the first patterned hard mask 674 corresponds to the forming step, Step 593, of the process flow 510 shown in FIG. 5. The patterned hard mask layer 674 is formed on the ridge waveguide layer 672 of the structure that includes the substrate 660, the optional etch stop layer 662, and the stack of semiconductor layers 675. Hard mask layer 674 may be, for example, a layer of silicon dioxide, silicon oxynitride, or silicon nitride. Other hard mask layers or combinations of layers may also be used.

Referring to FIG. 6A(v), a schematic drawing is shown for which the first patterned hard mask layer 674 has been used as an etch mask to pattern a top portion of the ridge waveguide laser structure that includes the ridge waveguide layer 672. The patterning of the ridge waveguide layer 672 corresponds to the patterning step, Step 594, of FIG. 5. In embodiments that include an optional second etch stop layer 669, the etch process to pattern the ridge waveguide layer 672 is stopped on or near the second etch stop layer 669. In other embodiments, the etch stop does not stop on the etch stop but just above or just below the optional second etch stop layer 669.

Referring to FIG. 6A(vi), a schematic drawing is shown in which a second mask layer 676 has been formed over the first patterned hard mask 674, the ridge waveguide layer 672, and the exposed portion of either the optional second etch stop layer, if present, or other exposed layer in the stack of semiconductor layers 675, such as layer 671, for example.

Referring to FIG. 6A(vii), a schematic drawing is shown in which the second mask layer 676, formed over the patterned hard mask 674 and ridge waveguide layer 672, has been patterned to expose the underlying stack of semiconductor layers that may include the optional second etch stop layer 669. This patterning, in embodiments, provides the areal layout for the bottom portion of the laser structure and for the bottom portions of the alignment aids 680. The formation of the second mask layer 676 as shown in FIG. 6A(vi), in conjunction with the subsequent patterning of this second mask layer 676 as shown in FIG. 6A(vii), corresponds to forming step, Step 595 of FIG. 5.

Referring to FIG. 6A(viii), a schematic drawing is shown in which the patterned second mask layer 676 has been used as an etching or patterning mask to pattern a bottom portion of the stack of semiconductor layers that is exposed through openings in the second mask layer 676, and that includes all or a portion of layer 671, layer 666, and the layer 664. The patterning of the exposed bottom portion of the stack of semiconductor layers corresponds to the patterning step, Step 596, of Process 510 shown in FIG. 5. The patterning step, Step 596 is stopped on the optional first etch stop layer 662, if present, or just below this first etch stop layer 662. The profile of the etched features show a typical contour as might be anticipated after a number of etches of the various films in the stack of semiconductors. In an example embodiment, for example, the top layers in the structure that include the second etch stop layer 669, the grating layer 671, and the layers 666 are etched with an isotropic process that produces a rounded profile as shown and which is followed by a process that produces a straight, but retrograde profile as shown in the layer 664. A variety of etch processes can be used to pattern the layers in the structure using dry etch processes, wet chemical etch processes, or a combination of the dry and wet processes. Other forms of patterning may also be used in combination with or not in combination with the etch processes. The patterning of the bottom layers in the stack of layers results in an embodiment of the alignment aids 680 with the formation of the laser body as shown in FIG. 6A(viii).

In some embodiments, the hard mask may be left in place on the alignment aids 680 as shown in FIG. 6A(viii). In other embodiments, additional processing of the alignment aids that may, for example, include the removal of the remaining second hard mask layer 676 on the alignment aids 680. An example embodiment in which the hard mask 676 that remained after patterning is removed is shown in FIG. 6A(ix). An example embodiment in which the hard mask 674 that remained after patterning is removed is shown in FIG. 6A(x). Other processing steps may also be included.

In embodiments, the use of the same lithographic patterning step to form the alignment aids 680 and the laser pedestal provides lithographic level alignment precision between the features of the laser pedestal, and in particular the light emitting portion of the laser pedestal, and the alignment aids 680. The lithographic level alignment precision is obtained with the use of the same hard mask process to define the laser pedestal and the alignment aids.

The continuation of further processing of the structure corresponds to the continuing step, Step 597, of the Process 510 shown in FIG. 5. Continued processing of the optoelectrical die can include any remaining processing steps leading to the formation of functional optoelectrical die.

Referring to FIG. 6A(ix), a schematic drawing is shown of an embodiment in which the second mask layer 676 is optionally removed from the structure. In some embodiments, the second hard mask layer 676 is fully removed, as shown in FIG. 6A(ix). In other embodiments, the second hard mask 676 is partially removed. In some embodiments, the hard mask remains substantially in place. In the course of the fabrication of functional laser diodes, pathways for the electrical currents must be provided to each side of the p-n junction in order for the diode to function. Numerous methods for providing electrical contact to the bottom or side of the laser diode can be implemented with the removal or partial removal of the second mask layer 676.

Referring to FIG. 6A(x), a schematic drawing is shown in which one or more of the patterned first mask layer 674, the second mask layer 676, and first etch stop layer 662 are optionally removed from the structure. In some embodiments, the first hard mask 674 and second hard mask 676 are partially removed. In some other embodiments, only the second hard mask is removed. In some other embodiments, the hard mask remains substantially in place. In the course of the fabrication of functional laser diodes, pathways for the electrical currents must be provided to each side of the p-n junction in order for the diode to function. Numerous methods for providing electrical contacts to each side of the p-n junction can be implemented with the removal or partial removal of the first etch stop layer 662, particularly for embodiments in which a non-conductive first etch stop layer 662 is utilized in the structure. Additionally, methods for providing electrical contact to one or more of the top and side of the ridge waveguide layer 672 can be implemented with the removal or partial removal of one or more of the first hard mask 674 and the second hard mask 676.

Figure 6B:
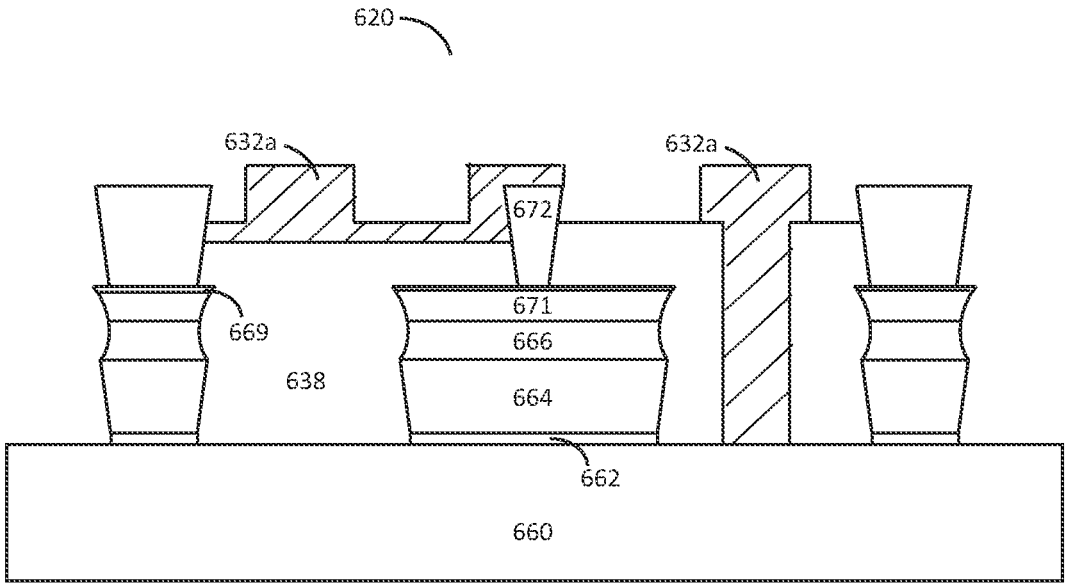
FIG. 6B shows a portion of the process flow of the embodiment described in FIG. 5 for the fabrication of the RWG laser optoelectrical die with mechanical alignment aids.

Referring to FIG. 6B, a schematic drawing is shown of an embodiment for which the metal contacts 632a are formed. In the example embodiment shown, the metal contact structure includes the metallization 632a and the intermetal dielectric layer 638 to illustrate an embodiment of an optoelectrical die 620 that includes the alignment aids 680 co-formed with the laser structure. Other structures and variations of the metal contacts can be used in other embodiments.

Figure 6C:
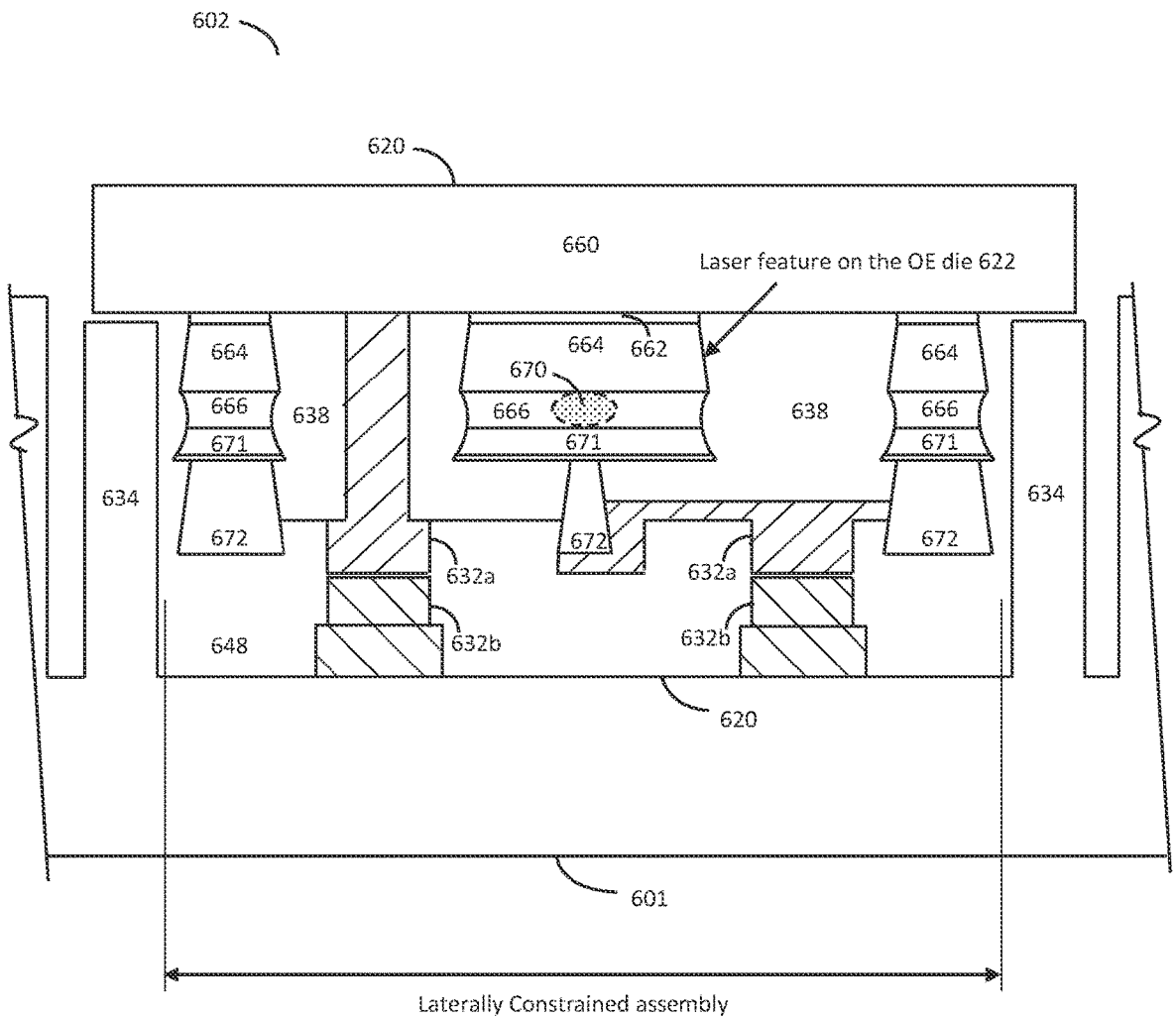
FIG. 6C shows a schematic drawing of a PIC assembly.

Referring to FIG. 6C, a schematic drawing is shown of a PIC assembly 602 in which the embodiment of the optoelectronic die 620 shown in FIG. 6B is combined with an interposer 601. The metal contacts 632a of the optoelectronic die 602 are shown substantially in alignment with the metal contacts 632b of the interposer 601. In the PIC assembly 602, the alignment aids that were formed concurrently with the laser pedestal 622 limit the movement of the optoelectronic die 620 within the constraints of the alignment pillars 634 of the interposer 601. The combination of the alignments aids 680 of the optoelectrical die 620 and the alignment pillars 634 of the interposer 601 ensure that the optical signal 670 emitted from the laser pedestal 622 is substantially aligned with optical features on the interposer 601 such as an optical or optoelectrical device on the interposer 601. In an example embodiment, the alignment signal 670 communicates with an optical waveguide integrated into the interposer 601. This and other alignment aspects are further described herein.

Referring to FIG. 7, an embodiment of a PIC assembly 702 that includes an optoelectrical die 720 with alignment aids 780 and an interposer 701, is shown. In the top-down view, the optoelectrical die 720 is shown in interposer cavity 748. Alignment aids 780 on the optoelectrical die 720 are positioned between the alignment pillars 734 on the interposer 701, and are free to move within the walls of the cavity in the "+y" and "−y" directions (as referenced) but movement is constrained in the "+x" and "−x" directions. Movement in the "+y" direction allows, for example, for alignment from the "at placement" position(indicated in FIG. 7) to the "after alignment" position (also indicated in FIG. 7). The "+y" direction is indicated by the reference coordinates shown in the upper left corner of the top-down view. The "+y" direction is further indicated by the open arrow shown at the left edge of the optoelectrical die 720 shown in the top-down view of FIG. 7. In the "after alignment" position shown, the optical axis 707a of the optical waveguide 744, or other optical device on or in the interposer 701, is substantially aligned with the optical axis 707b of the laser pedestal 722. Lateral movement of the optoelectrical die 720 is ultimately restricted by the walls of the cavity 748 in the embodiment as shown. The optoelectrical die 720 is shown in the embodiment to be in approximate contact with the wall of the cavity 748. Also shown in the top-down view of FIG. 7 is fiducial 714 in fiducial recess 749, used for example, in the placement of the optoelectrical die 720 onto the interposer 701. Fiducial 748 can be used, for example, for reference in automated or non-automated pick and place apparatus that may be used for placement of the die 720 onto interposer 701.

Section drawings A-A' and B-B' shown in FIG. 7 provide additional schematic views of the embodiment shown in assembly 702. In these section drawings, the surface 726 on the substrate 760 of the optoelectrical die 720 is shown to form a contact with the top surface 725 of the alignment pillars 734 on the interposer 701. This contact enables alignment or substantial alignment of the optical axis 707a of the optical waveguide 744, or other optical device on or in the interposer 701, with the optical axis 707b of the laser pedestal 722. Section A-A' further shows the fiducial 714 in fiducial recess 749, used for example, in the placement of the optoelectrical die 720 onto the interposer 701. Section B-B' further shows the optical signal 770 from the emission facet of the laser pedestal 722 with other features consistent with the top-down view and Section A-A'.

FIG. 7 shows an example embodiment in which the alignment aids 780 formed on an optoelectrical die 720 are utilized in the process of aligning of the optical axes 707b of a device such as a laser pedestal 722 with the optical axis 707a of an optical device such as a waveguide 744 on an interposer 701. Waveguide 744 may be a portion of a PIC formed on the interposer. After automated placement, assisted for example with the use of the fiducial 714, a die 720 is placed such that the alignment aids 780 on the die 720 are positioned between the alignment pillars 734 on the interposer 701. After placement of the die 720 onto the interposer 701 into a position at the left edge of the die 720 noted as "at placement", an alignment process is utilized to provide lateral movement in the "+y" direction as shown. Removal of the gap between the facet of the laser and the facet of the waveguide is beneficial in some applications for minimizing, for example, the loss of optical signal from the laser to the waveguide when the laser is activated.

In the example embodiment illustrated in the schematic drawings in FIG. 7, the use of the alignment aids 780 of the optoelectrical die 720 in conjunction with alignment pillars 734 on an interposer 701 can result in substantially improved alignment of the optical axis 707b of a laser pedestal 722 on the die 720 with the optical axis 707a of an optical device 744 on the interposer 701.

Figure 8A:
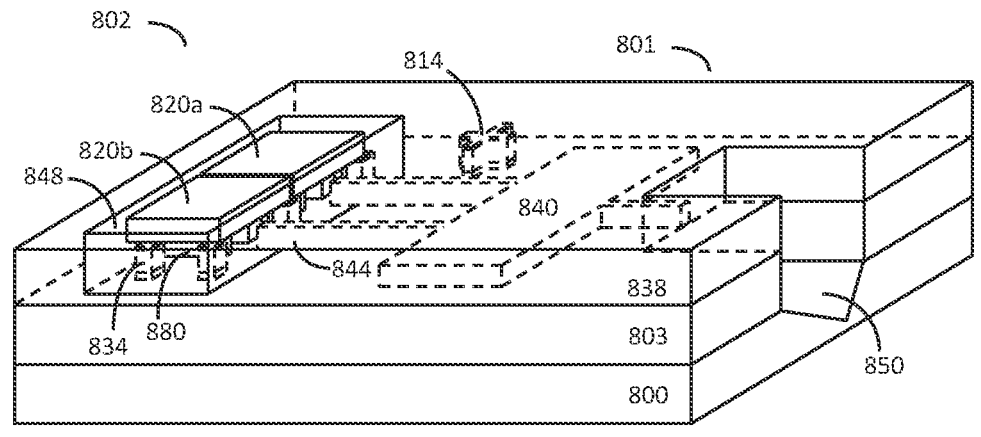
FIG. 8A shows a perspective drawing of an embodiment with two optoelectrical die mounted over alignment pillars on an interposer substrate.
Figure 8B:
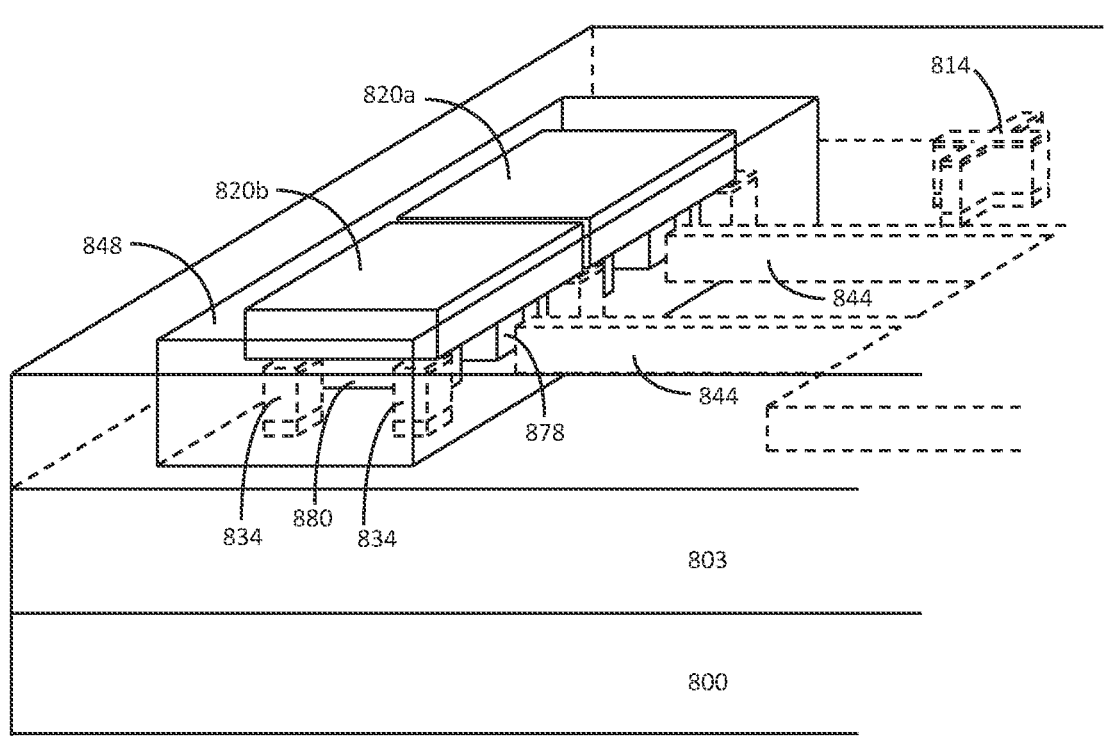
FIG. 8B shows an enlarged view of the optoelectrical die in the interposer cavity.
Figure 8C:
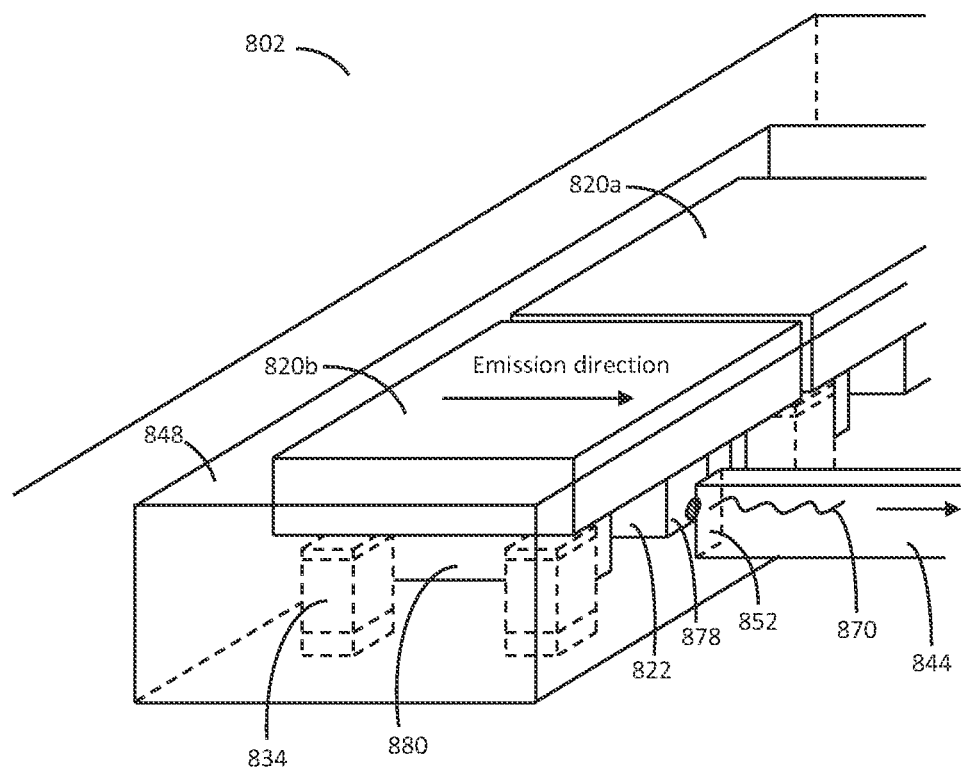
FIG. 8C shows a further enlarged view of the embodiment with two optoelectrical die in an interposer cavity shown with mechanical alignment aids and showing the emission facet of the lasers in alignment with optical waveguides on an interposer.

Referring to FIG. 8A-8C, perspective drawings are shown of an embodiment of a PIC assembly 802 that includes optoelectrical die 820a, 820b mounted on an interposer structure that further illustrates embodiments of the mechanical alignment aids 880 and the use of these aids on the positioning of optoelectrical die 820a, 820b in cavity 848 of the interposer 801. In the embodiment shown in FIG. 8A, interposer 801 includes substrate 800, electrical interconnect layer 803, optical waveguide layer 805, and insulating dielectric layer 838. One or more optical devices 840 can be fabricated in optical waveguide layer 805 and can include waveguides 844 and other optical devices 840 that can be fabricated wholly or in part from the optical waveguide layer 805. All or part of optical devices 840 can be fabricated from other layers, and can be fabricated elsewhere and mounted onto the interposer 801. Interposer 801, in some embodiments, can have one or more v-grooves 850 or other means for mounting optical fiber cables to the interposer 801. Fiducial 814 is also shown in FIG. 8A and FIG. 8B. Fiducial 814 is shown in dielectric layer 838 although in other embodiments, the fiducial may not be contained within the dielectric layer to improve visibility.

Interposer 801 shows a cavity 848 with multiple mounted optoelectrical die 820*a,*820*b* in FIG. 8A, and also shown in FIG. 8B in an enlarged view of the cavity 848 from FIG. 8A. FIG. 8B shows a perspective illustration of the relative positions of the optoelectrical die 820*a*, 820*b* in an interposer 801 configured for multiple optoelectrical die. In some embodiments, a single optoelectrical die is mounted in the cavity of an interposer to form the PIC assembly. In other embodiments, multiple optoelectrical die are mounted in the cavity of the interposer. In some embodiments, multiple optical devices, such as multiple ridge waveguide lasers for example, are formed on the same optoelectrical die and mounted onto the interposer.

In the further enlarged perspective view of the cavity 848 shown in FIG. 8C, the laser pedestal 822 is shown with emitted optical signal 870 (during operation). Signal 870 is emitted from facet 878 of the laser pedestal 822. Facet 878 of the laser pedestal 822 is aligned with facet 852 of the waveguide 844. Alignment aids 880, positioned between alignment pillars 834 of the interposer 801, are used to restrict the movement of the between the optoelectrical die 820*b* to enable substantial transfer of optical signal 870 from the laser to the waveguide 844 during activation of the laser.

Referring to FIG. 9A-9D, schematic drawings are provided that illustrate various example embodiments of alignment aids 980 on optoelectrical die substrates 960.

Figure 9A:
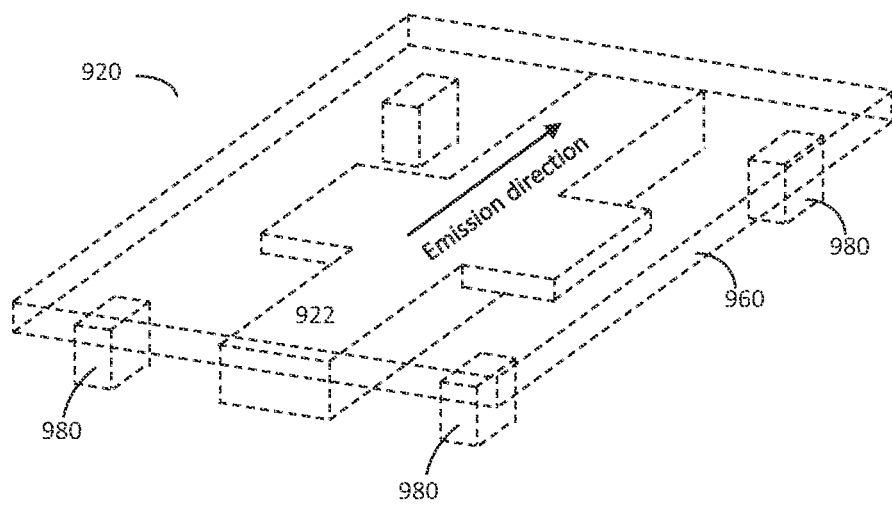
FIG. 9A shows a perspective view of an optoelectrical die with an embodiment of alignment aids formed on the die.

In FIG. 9A, a perspective drawing shows an optoelectrical die 920 with laser pedestal 922 and an embodiment of the alignment aids 980 that includes four pillar structures arranged on the die as shown in the figure. The direction of optical emission for the laser pedestal 922 in the embodiment shown is indicated on the laser pedestal 922. In the embodiment shown in FIG. 9A, four alignment pillars are used. In other embodiments, other numbers of pillars can be used. And in yet other embodiments, other positions for the alignment aids can be used. And in yet other embodiments, other numbers of pillars and other positions on the substrate can be used.

Figure 9B:
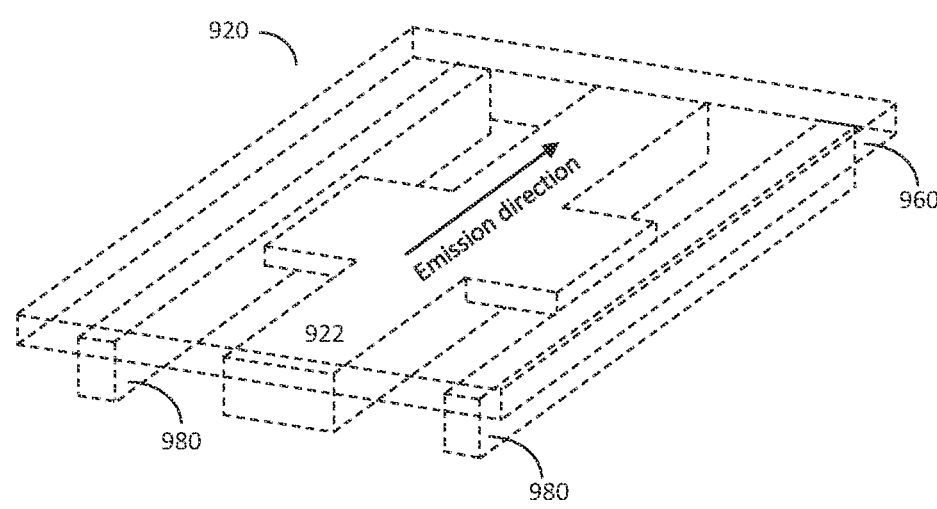
FIG. 9B shows a perspective view of an optoelectrical die with another embodiment of alignment aids. Illustration also shows the direction of the optical emission from the laser device and an embodiment of the emitted signal from the optical facet of the laser.

Referring to FIG. 9B, another embodiment is shown for alignment aids 980 on an optoelectrical die 920 that includes a laser pedestal 922. The direction of emission for the embodiment shown is indicated on the laser pedestal 922. The alignment aids 980 are shown in the embodiment in FIG. 9B as two wall-like alignment aids, with one on either side of the substrate 960 as shown. In other embodiments, other numbers of wall-like alignment aids can be used. And in yet other embodiments, other positions for the wall-like alignment aids can be used.

Figure 9C:
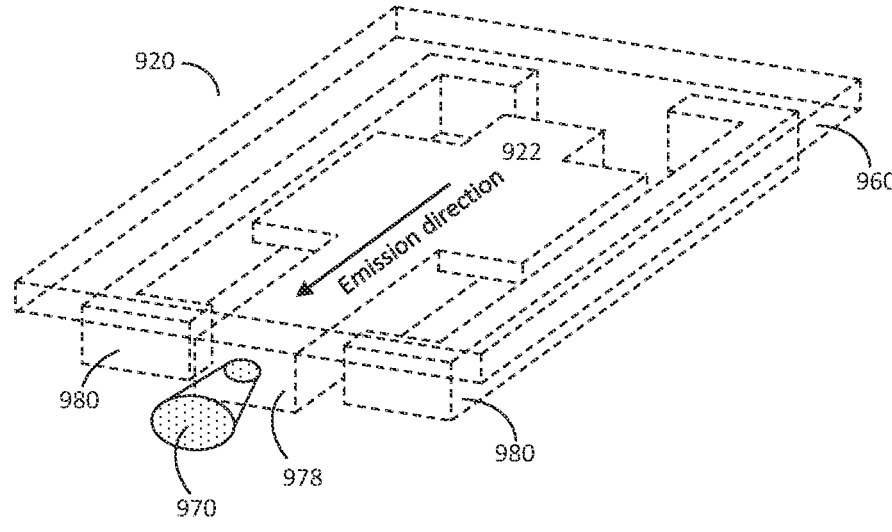
FIG. 9C shows a perspective view of an optoelectrical die with yet another embodiment of alignment aids.

Referring to FIG. 9C, another embodiment is shown for alignment aids 980 on an optoelectrical die 920 that includes a laser pedestal 922. The direction of emission upon activation of the laser diode for the embodiment shown is indicated on the laser pedestal 922. Also shown in FIG. 9C is optical signal 970 from the laser pedestal 922. The alignment aids 980 are shown in the embodiment in FIG. 9C as two wall-like alignment aids with right-angled features at the ends. One of the two wall-like alignment aids with right-angled features is formed on either side of the substrate 960 as shown. In other embodiments, other numbers of wall-like alignment aids with right angled features can be used. And in yet other embodiments, other angles for the right-angled return feature can be used. In yet other embodiments, the wall-like alignment features may be segmented into multiple wall-like features.

Figure 9D:
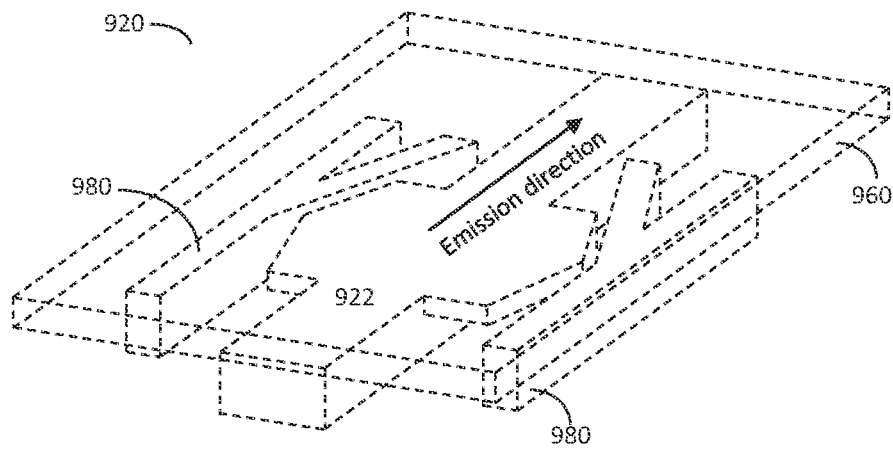
FIG. 9D shows a perspective view of an optoelectrical die with yet another embodiment of alignment aids.

Referring to FIG. 9D, another embodiment is shown for alignment aids 980 on an optoelectrical die 920 that includes a laser pedestal 922. The direction of emission for the embodiment shown is indicated on the laser pedestal 922. The alignment aids 980 are shown in the embodiment in FIG. 9D as two wall-like alignment aids. In the embodiment shown in FIG. 9D, each of the wall-like alignment aids 980 has a triangular cavity formed at one end. Each of the two wall-like alignment aids with the triangular cavities is formed on either side of the substrate 960 as shown. In other embodiments, other numbers of wall-like alignment aids with triangular cavities can be used. And in yet other embodiments, other angles for the triangular cavities can be used. In yet other embodiments, the wall-like alignment features may be segmented into multiple wall-like features.

The embodiments of the optoelectrical die 920 with alignment aids 980 shown in FIG. 9A-9D are provided to show examples of various configurations of the alignment aids 980. Aspects of the alignment aids 980 shown in FIG. 9A-9D include pillar structures, wall structures, wall structures with angled features, and wall structures with cavities that can be used in combination with mating structures on a complementary substrate to which the optoelectrical die 920 can be mounted. In addition to these aspects of the alignment features 980, other aspects can include variations in the heights of one or more parts or sections of the various alignment aids 980 and variations of the widths of one or more parts or sections of the alignment aids 980. Additionally, as further described herein, the alignment features may form an enclosure within which complementary alignment features on an interposer are positioned.

The embodiments of the alignment aids 980 shown in FIG. 9A-9D, work favorably when combined with complementary-shaped alignment features formed on an interposer substrate. Examples of complementary-shaped alignment features formed on the interposer are shown in FIGS. 10 and 11.

Figure 10A:
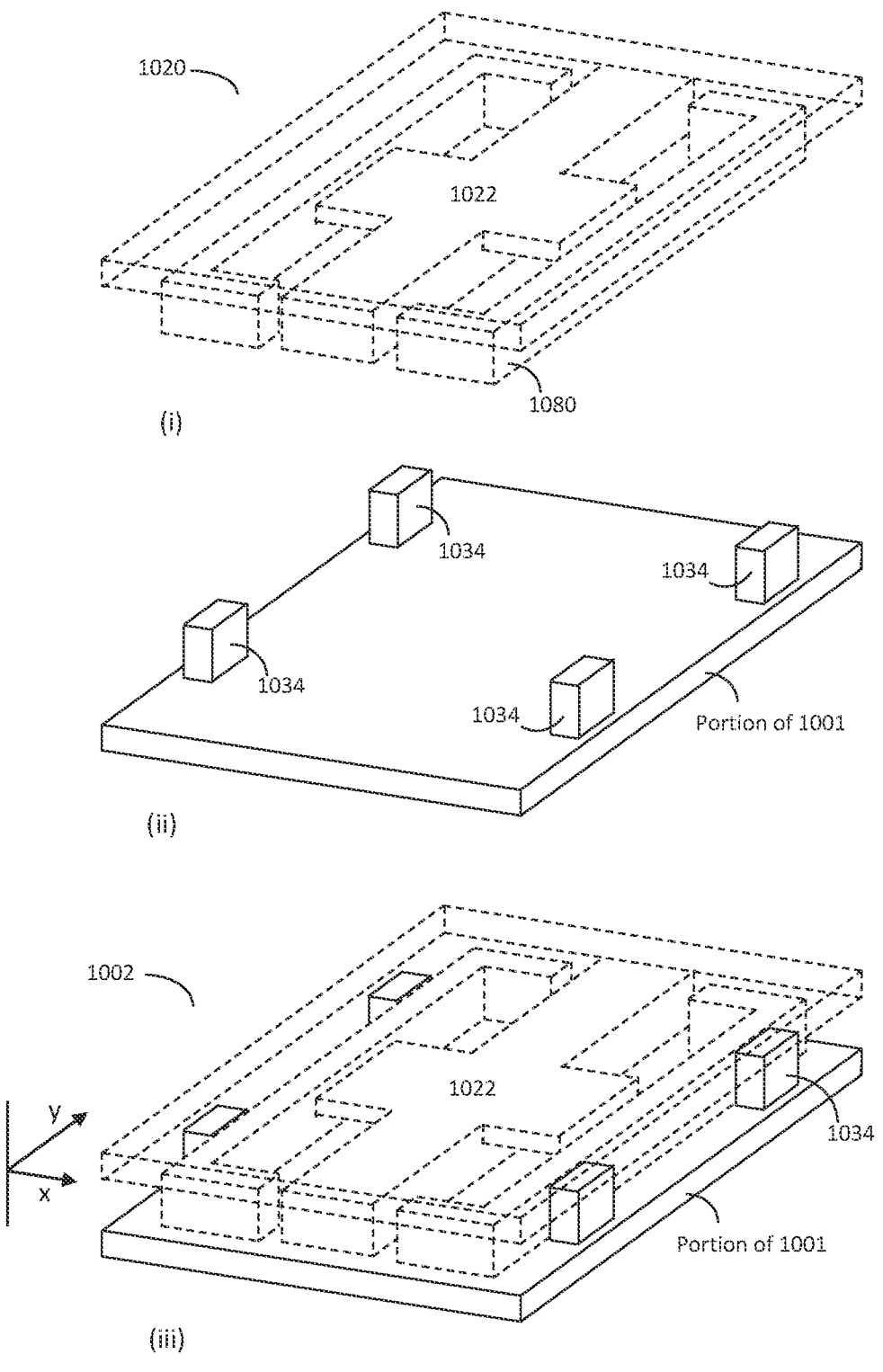
FIG. 10A shows perspective drawings of (i) an embodiment of an optoelectrical planar laser die with mechanical alignment aids, (ii) a portion of an interposer substrate with alignment aids, and (iii) an optoelectrical planar laser die with mechanical alignment aids (dotted lines) mounted on a portion of an interposer substrate (solid lines) with complementary mechanical alignment aids.

In FIGS. 10A(i)-10A(iii), an embodiment for the optoelectrical die 1020 with alignment aids 1080, similar to the embodiment of the alignment aids 980 shown in FIG. 9(iii), is shown with a portion of an interposer 1001. The portion of the interposer 1001 is shown with alignment structures 1034 that are complementary in shape to the alignment aids 1080 on the optoelectrical die 1020 shown in FIG. 10A(i).

In FIG. 10A(i), the optoelectrical die 1020 is shown with laser pedestal 1022 and alignment aids 1080. In FIG. 10A (ii), the portion of the interposer 1001 is shown with alignment pillars 1034. The alignment pillars 1034 of FIG. 10A(ii) are complementary in shape to the alignment aids 1080 formed on the optoelectrical die 1020 shown in FIG. 10A(i).

FIG. 10A(iii) shows the combined assembly 1002 in which the optoelectrical die 1020 is positioned over the complementary-shaped alignment pillars 1034 on the interposer 1001. In the position shown in FIG. 10A(iii), the optoelectrical die 1020 is free to move laterally in the "+y" and "−y" directions but movement is restricted in the "+x" and "−x" directions as referenced.

Referring to FIG. 10B, the optoelectrical die 1020 is shown with a larger portion of the interposer 1001 that includes the interposer cavity 1048 and optical waveguide 1044. Lateral movement of the optoelectrical die 1020 in the cavity 1048 facilitates positioning of the facet 1078 of the laser pedestal 1022 and the facet 1052 of the waveguide 1044. In the embodiment shown in FIG. 10B, the lateral movement in the "+y" direction is not limited directly by the alignment aid 1080, although the lateral movement can be limited in this embodiment by one or more of a portion of the optoelectrical die 1020 or a portion of the laser pedestal 1022 forming a contact with a portion of one or more of the wall of the cavity 1048 and the waveguide 1044. Although not shown in FIG. 10B, the alignment aid 1080, can in some embodiments, form a contact with the wall of the cavity 1048 to limit the lateral movement in the "+y" direction as shown.

Figure 11A:
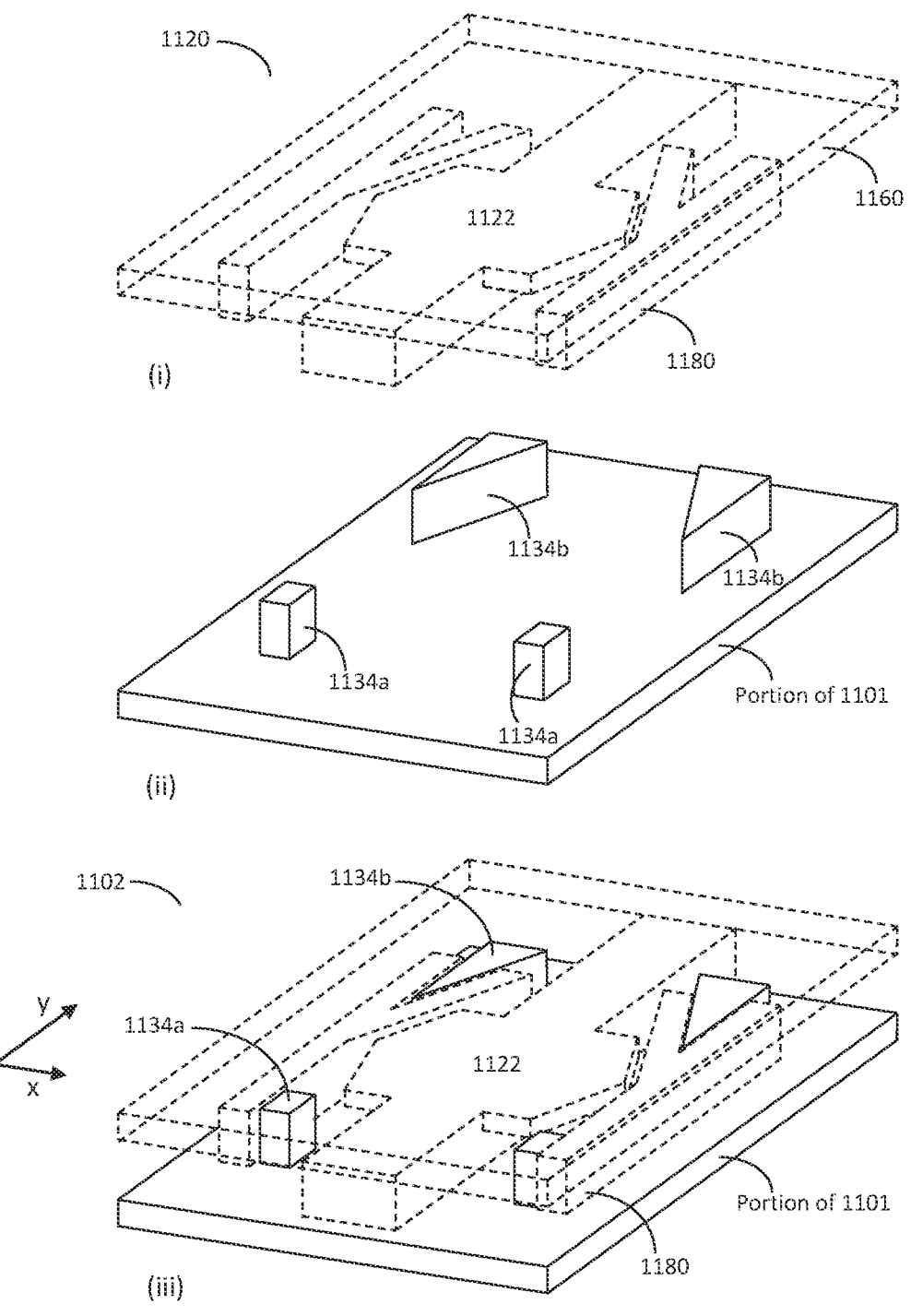
FIG. 11A shows an embodiment of an optoelectrical die with alignment aids: (i) the optoelectrical die with alignment aids, (ii) a portion of an interposer with an embodiment of complementary alignment aids for the alignment features shown in FIG. 11(*i*), and (iii) an assembly that includes the laser die of FIG. 11(*i*) and the portion of an interposer shown in FIG. 11(*ii*).

In FIGS. 11A(i)-11A(iii), another embodiment for the optoelectrical die 1120 with alignment aids 1180, similar to the embodiment of the alignment aids 980 shown in FIG. 9(iv), is shown with a portion of an interposer 1101. The portion of the interposer 1101 is shown with alignment structures 1134a, 1134b that are complementary in shape to the alignment aids 1180 on the optoelectrical die 1120 shown in FIG. 11A(i).

In FIG. 11A(i), the optoelectrical die 1120 is shown with laser pedestal 1122, and alignment aids 1180. In FIG. 11A(ii), the portion of the interposer 1101 is shown with alignment pillars 1134a,1334b. Alignment pillars 1134a, 1134b of FIG. 11A(ii) are complementary in shape to the alignment aids 1180 formed on the optoelectrical die 1120 shown in FIG. 11A(i).

FIG. 11A(iii) shows the combined assembly 1102 in which the optoelectrical die 1120 is positioned over the complementary-shaped alignment pillars 1134a,1134b on the interposer 1101. In the position shown in FIG. 11A(iii), lateral movement of the optoelectrical die 1120 is restricted in the "+x" and "−x" directions, although the optoelectrical die 1120 is free to move within a short distance laterally in the "+y" and "−y" directions up to the point in the "+y" direction at which a contact is formed between the alignment aids 1180 and the triangularly-shaped alignment pillars 1134b on the interposer 1101.

Referring to FIG. 11B, the optoelectrical die 1120 of PIC assembly 1102 is shown with a larger portion of the interposer 1101 that includes the interposer cavity 1148 and optical waveguide 1144. Lateral movement of the optoelectrical die 1120 in the cavity 1148 facilitates favorable positioning of the facet 1178 of the laser pedestal 1122 and the facet 1152 of the waveguide 1144. Favorable positioning of the facet 1178 of the laser pedestal 1122 and the facet 1152 of the waveguide 1144 can lead to, for example, low or minimal losses in the amplitude or integrity of the optical signals that are transferred from the laser pedestal 1122 to the waveguide 1144 upon powering of the laser. In the embodiment shown in FIG. 11B, the lateral movement in the "+y" direction is limited by the surface contact that is formed between the triangular cavity in one or more of the alignment aids 1180 and one or more of the triangular-shaped alignment pillars 1134b.

The triangular cavity in the alignment aids 1180, shown in FIGS. 11A and 11B, limits the lateral movement of the optoelectrical die 1120 when positioned over complementary-shaped features 1134b formed on the interposer 1101. Additionally, the alignment aids 1134a, 1134b can both restrict movement in the "+x" and "−x" directions in addition to the restriction in movement in the "+y" direction provided by the alignment aid 1134b (as indicated by the reference coordinate system shown in FIG. 11A and FIG. 11B.)

Figure 12A:
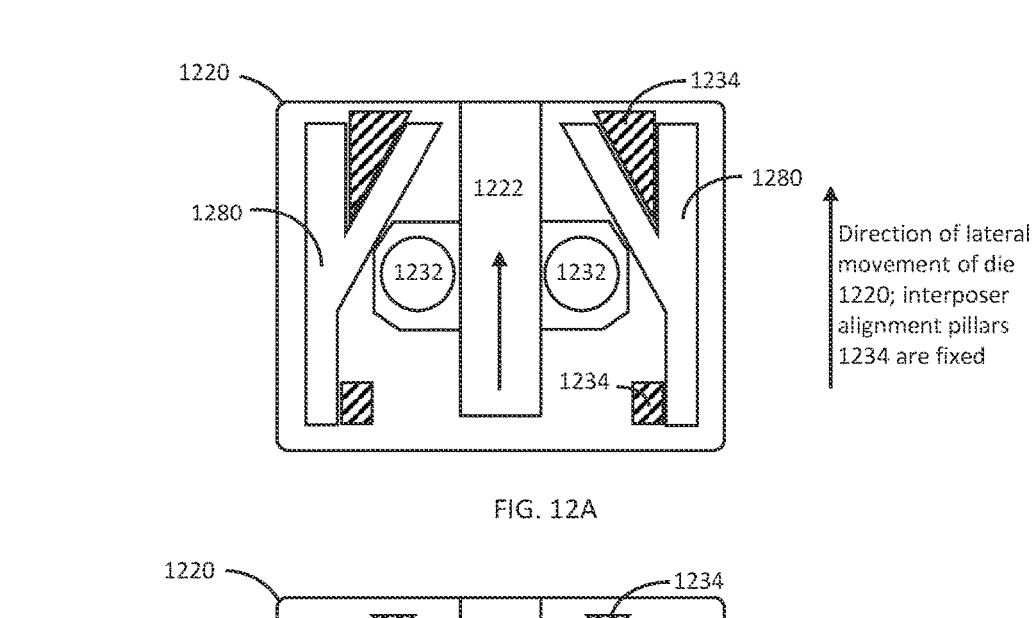
FIG. 12A-12L show embodiments of optoelectrical die with alignment aids and with complementary interposer alignment pillars.
Figure 12B:
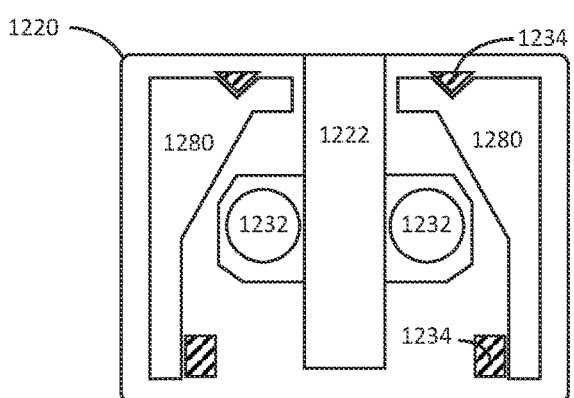
Figure 12C:
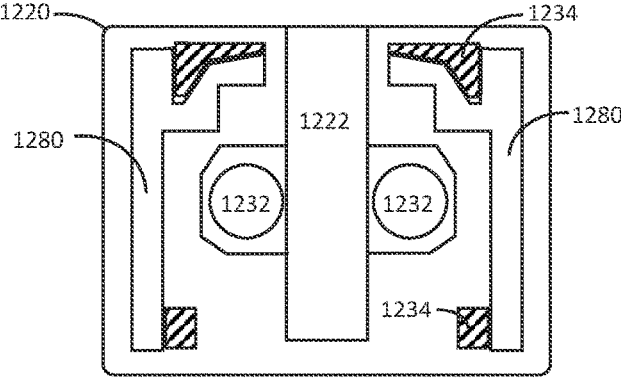
Figure 12D:
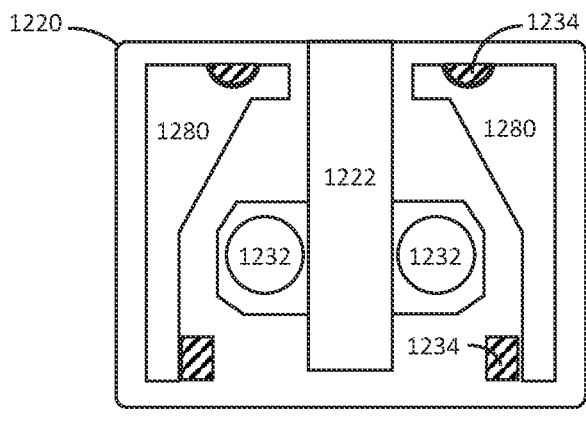
Figure 12E:
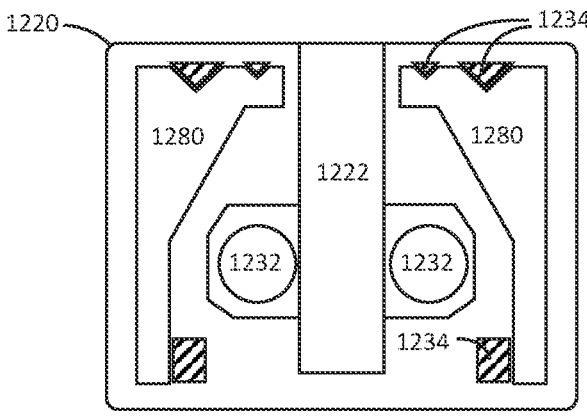
Figure 12F:
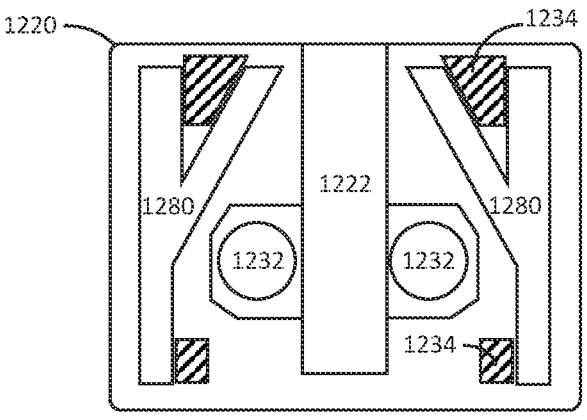
Figure 12G:
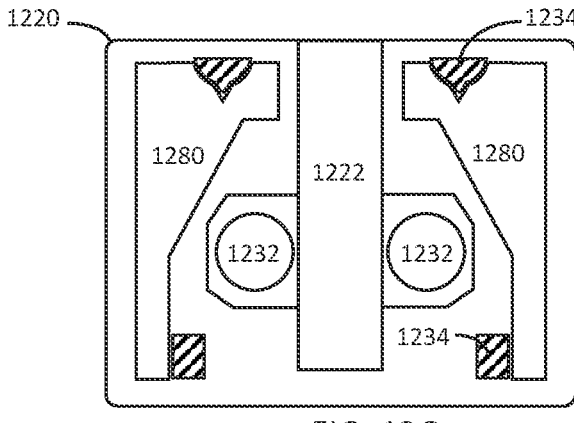
Figure 12H:
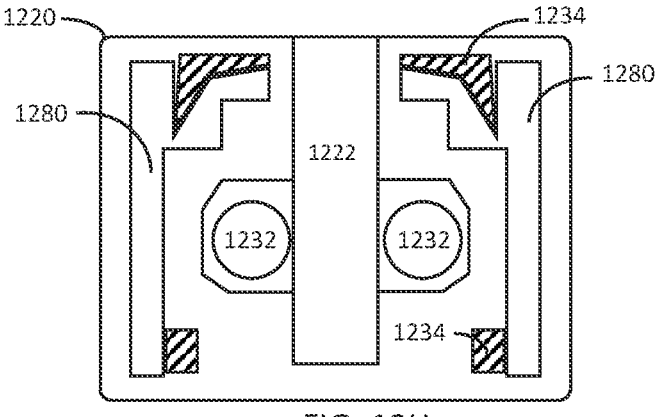
Figure 12I:
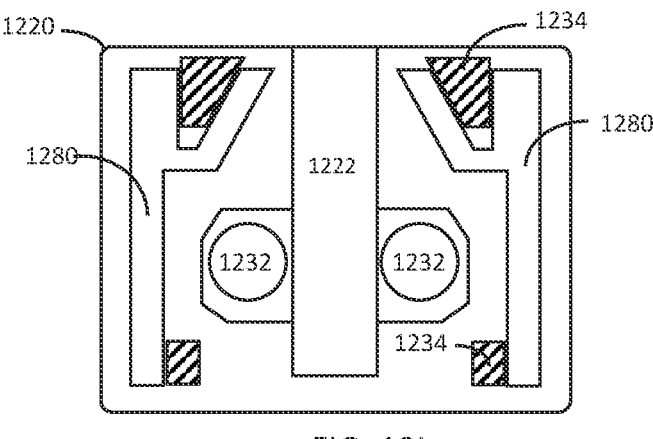
Figure 12J:
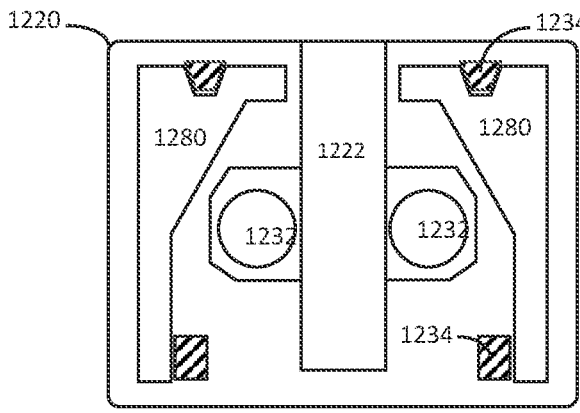
Figure 12K:
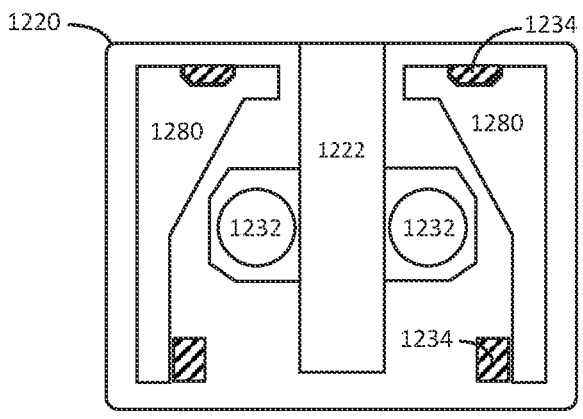
Figure 12L:
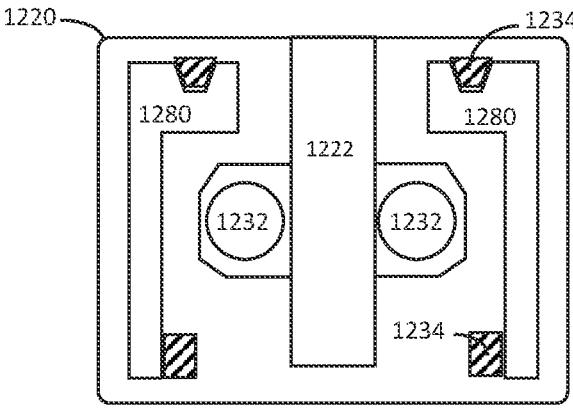

Additional example embodiments that can be used to restrict the lateral movement of the optoelectrical die 1120 on the interposer 1101 and that can be used to guide the optoelectrical die into an aligned or otherwise preferred position are provided in FIGS. 12(i)-12(xii).

Referring to FIG. 12A-12L, various example embodiments are shown of alignment aids 1280 on optoelectrical die 1220 with examples of corresponding complementary-shaped interposer alignment pillars 1234. The corresponding interposer-based alignment pillars are shaded in FIG. 12A-12L.

The example embodiments shown in FIG. 12A-12L are similar to the embodiment shown in FIG. 11 in that the combined alignment features of the optoelectrical die and the interposer have features in the structure that limit the lateral movement of the optoelectrical die on the interposer. The example embodiment shown in FIG. 12(i) is similar to the embodiment described in FIGS. 11A-11B. The embodiment of the optoelectrical die 1220 includes metallization pads 1232 as shown in FIG. 12A. The arrow shows the direction of lateral movement of the optoelectrical die 1220 after placement over the fixed position alignment pillars 1234 on the interposer. Additional example configurations of alignment aids 1280 on an embodiment of optoelectrical die 1220 and the alignment pillars 1234 for complementary interposers are provided in FIG. 12A-12L.

The alignment aids shown in FIG. 12A-12L allow for positioning of the optoelectrical die 1220 into a placement location into interposer cavities (such as cavity 1148) prior to movement into an aligned position as described in accordance with FIG. 7, for example. The configurations of alignment aids 1280 in FIG. 12A-12L enable the optical die 1220 to be guided into the aligned position on the interposer using a suitable alignment method. As the optoelectrical die 1220 are guided into position over the alignment pillars 1234, the lateral movement of the die is constrained to limit the movement of the die 1220 until the movement leads to a nesting of the capturing aspects of the alignment aids 1280 with the complementary shape of the corresponding alignment pillars 1234 of the interposer. The placement of the optoelectrical die 1220 over the alignment pillar configurations 1234 such as those shown in FIG. 12A-12L enable precise alignment of optical devices when these alignment pillar configurations are utilized in alignment schemes such as those described, for example, in FIGS. 1-11, among others. In addition to the example structures shown in FIG. 12A-12L, other similar structures can also be used and remain within the scope of embodiments.

FIG. 12A-12L illustrate a number of example shapes and features of alignment aids on optoelectrical die 1220 and complementary alignment aids 1234 on interposer 1201. These figures illustrate attributes of these alignment features as utilized for the purpose of providing alignment of optoelectrical die, and the optical devices thereon, in the lateral directions. The vertical alignment is not, in general, dependent on the shape of the alignment pillars 1234 in embodiments. Key attributes for the alignment pillar alignment aids include those detailed in the descriptions provided herein. In each of the embodiments shown in FIG. 12A-12L, the complementary shapes of the alignment pillars 1234 of the interposer and the alignment aids 1280 of the optoelectrical die 1220 provide lateral guidance in both the "x" and "y" directions as shown in the reference coordinate system shown in FIG. 12A and as consistent with the reference coordinates shown in other figures included herein. The lateral guidance in the embodiments shown in FIG. 12A-12L is such to form substantial alignment of the optical axes of the mounted laser device on the optoelectrical die 1220 and an optical waveguide or other optical device to which the optical axis of the laser device on the optoelectrical die 1220 is to be aligned. The specific alignment features shown in FIG. 12A-12L are not intended to limit the scope of embodiments but rather to illustrate examples of complementary alignment structures on optoelectrical die and interposers to which the optoelectrical die can be mounted.

Referring to FIG. 13, top-down illustrations of embodiments are shown of alignment aids 1380a,1380b on optoelectrical die 1320 with examples of corresponding complementary-shaped alignment pillars 1334a,1334b on the interposer. FIG. 13 shows examples of pillar type alignment structures and cavity type alignment structures that limit the lateral movement of the optoelectrical die on the interposer wherein the pillar type alignment structures are positioned within the cavity type alignment structures. Metallization pads 1332 on die 1320 are also shown.

Figures 13A, 13B:
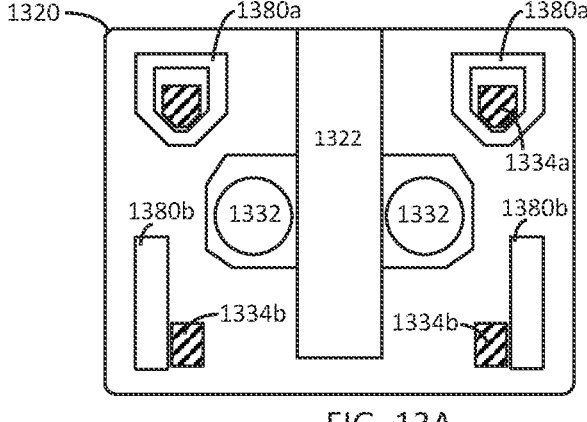
FIG. 13A shows an embodiment of an optoelectrical die having cavity type alignment aids on an interposer having pilar type alignment aids, and (ii)
FIG. 13B shows an embodiment of an optoelectrical die having pillar type alignment aids on an interposer having cavity type alignment aids.

FIG. 13A shows an embodiment of an alignment aid 1380a on optoelectrical die 1320 configured with corresponding complementary-shaped interposer alignment aids 1334a for which alignment aids 1380a on the optoelectrical die 1320 are of a pillar type alignment aid and alignment aids 1334a on the interposer are cavity type alignment aids. In the embodiment shown, alignment aids 1380a that are pillar type alignment aids are paired with alignment aids 1334a on the interposer that are cavity type alignment aids. In the assembly shown in FIG. 13A, all or a portion of the protruding portion of the pillar type alignment aid on the optoelectrical die is positioned within the enclosed protruding portion of the cavity type alignment aid on the interposer as shown.

FIG. 13B shows another embodiment of alignment aid 1380a on optoelectrical die 1320 configured with corresponding complementary-shaped interposer alignment pillars 1334a for which alignment aids 1380a on the optoelectrical die 1320 are of a cavity type alignment aid and alignment aids 1334a on the interposer are pillar type alignment aids. In the embodiment shown, alignment aids 1380a that are cavity type alignment aids are paired with alignment aids 1334a on the interposer that are pillar type alignment aids. In the assembly shown in FIG. 13B, all or a portion of the protruding portion of the pillar type alignment aid on the interposer is positioned within the enclosed protruding portion of the cavity type alignment aid on the optoelectrical die as shown.

FIG. 13A and FIG. 13B also show additional lateral alignment aids 1380b on the optoelectrical die 1320 and alignment aids 1334b on the interposer that may be included in some embodiments.

It should be noted that pillar type alignment aids and cavity type alignment aids having other complementary shapes and combinations of shapes may also be used in other embodiments and remain within the scope of embodiments. A wide range of cavity type alignment aids 1380a on the die 1320 can be used to form one or more points of contact with pillar type alignment aids on the interposer. Similarly, a wide range of pillar type alignment aids 1380a on the die can be used to form one or more points of contact with cavity type alignment aids on the interposer. These points of contact restrict or stop the movement of the die 1320 in alignment processes following placement of the die 1320 onto interposers on which the complementary alignment aids are provided.

Figure 14B:
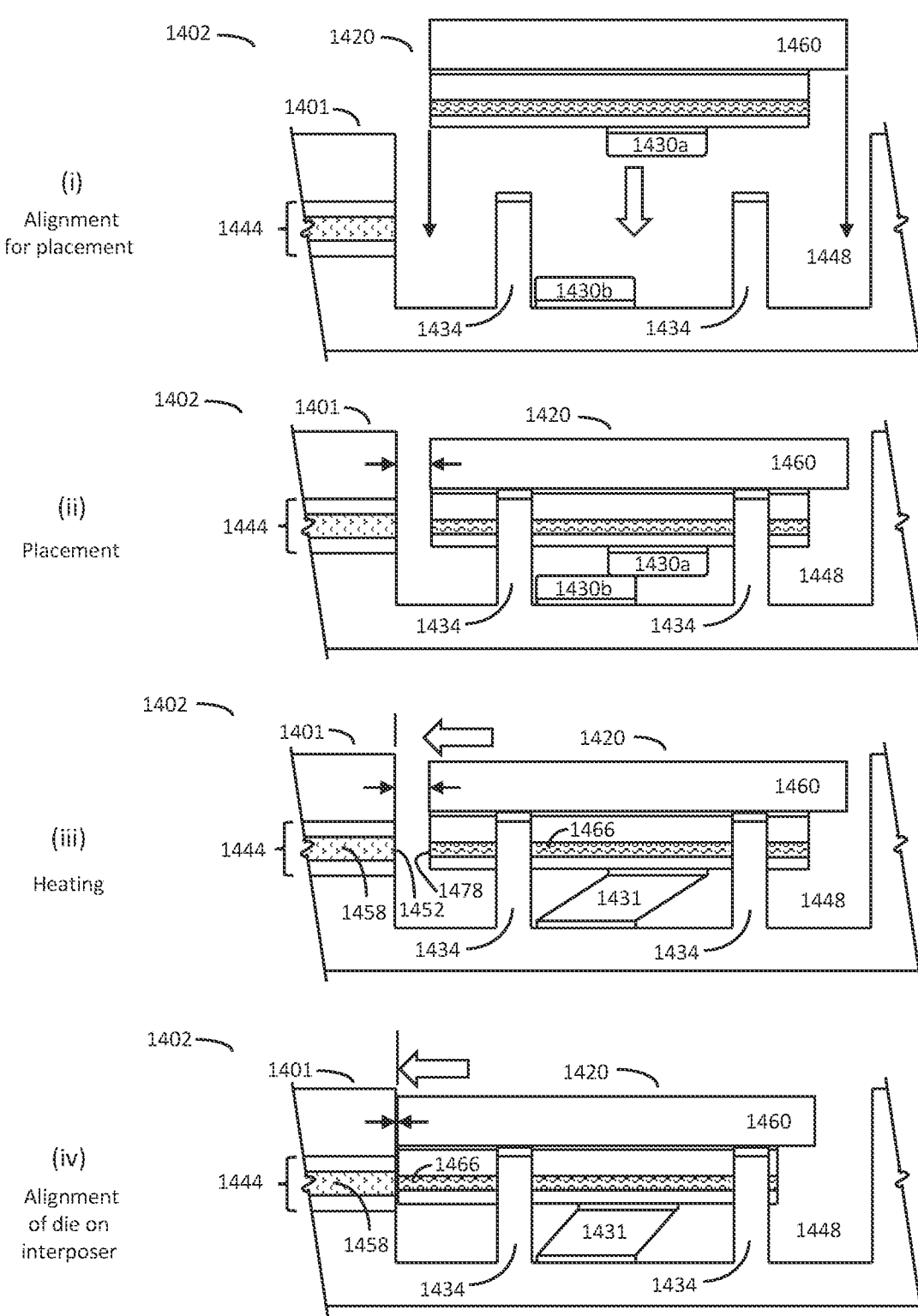
FIG. 14B shows schematic side-views of embodiments of optoelectrical die and interposer with metallization: (i) with optoelectrical die in alignment prior to placement onto interposer, (ii) after placement of the optoelectrical die onto the interposer, (iii) after heating of the assembly above the melting temperature of the metallization, and (iv) after the alignment of an optical feature on the optoelectrical die with an optical feature on the interposer.

Referring to FIGS. 14A-14C, a series of drawings are provided that illustrate an example of a method of moving mounted optoelectrical die into alignment on an interposer. In this example, surface tension in molten solder is utilized after placement of one or more optoelectrical die onto an interposer to draw the optical axis of one or more devices on the die into alignment with one or more optical features on the interposer. The complementary alignment aids on the optoelectrical die and on the interposer facilitate this alignment. In this method of alignment, the surface tension in the metallization upon melting draws the metallization of the movable optoelectrical die into alignment with the metallization of the interposer. Other alignment methods such as physical placement and the application of a mechanical force to the mounted die may also be used. Cooling of the molten solder upon alignment can affix the die into the aligned position. Use of one or more of an adhesive, an epoxy, a passivation layer, or other method of affixing of the die after alignment may also be used.

In FIG. 14A(i), an embodiment of an optoelectrical die 1420 is shown with alignment aids 1480 and laser pedestal 1422. Metallization pads 1430a are used to form electrical contacts to the laser diode on the optoelectrical die 1420. The laser pedestal 1422 and the alignment aids 1480 are formed on the substrate 1460 of the optoelectrical die 1420. In FIG. 14A(ii), a portion of interposer 1401 is shown with alignment pillars 1434 and metallization pads 1430b formed in interposer cavity 1448.

Metallization pads 1430a, 1430b in some embodiments, are comprised of a terminal plate and a solder contact. A terminal plate as used herein refers to a termination for a length of metallization such as a layer of aluminum, gold, or other metal layer used in the formation of a metal interconnect on the optoelectrical die or on the interposer. On the interposer, for example, interconnections between devices may be formed from a patterned layer of aluminum or copper. The interconnection layer may terminate at a terminal plate. In some embodiments, the terminal plate may include a layer of solder. In other embodiments, the terminal plate may not include a layer of solder. Similarly, on an embodiment of an optoelectrical die, for example, a metal interconnect may be formed between a doped contact layer of the laser diode structure and a terminal plate. In some embodiments, the terminal plate may include a layer of solder. In other embodiments, the terminal plate on the optoelectrical die may not include a layer of solder. In the embodiment shown in FIG. 14, solder layers are shown on both metallization pads 1430a,1430b.

Also shown in FIG. 14A(ii) is an optical device 1444, a waveguide for example, to which the emission facet of the laser pedestal 1422 of FIG. 14A(i) is to be aligned, as described herein. In FIG. 14A(iii), the optoelectrical die 1420 is shown positioned over the interposer 1401 prior to placement. A sequence of steps in the placement and alignment of the optoelectrical die 1420 onto the interposer 1401 is further described in FIG. 14B.

Referring to FIG. 14B(i), a cross section of optoelectrical die 1420 is shown positioned over the interposer 1401 prior to placement to form a portion of the PIC assembly 1402 that includes the die 1420 and the interposer 1401. Metallization pads 1430a are shown in partial alignment with the metallization pads 1430b in the cavity 1448 on the interposer 1401 prior to placement. In FIG. 14B(ii), the optoelectrical die 1420 is shown after placement into the cavity 1448 on the interposer 1401. In an embodiment, the cavity 1448 has alignment pillars 1434 that come into contact with the substrate 1460 of the optoelectrical die 1420. In another embodiment, the metallization contacts 1430*a* and metallization contacts 1430*b* come into contact after placement. In embodiments, after placement, the optoelectrical die 1420 typically requires a lateral movement into a final aligned position to minimize the potential for optical signal loss between the laser pedestal 1422 on the die 1420 and the optical device 1444 of the interposer 1401. In the alignment method described in FIG. 14B, this movement is facilitated by heating and melting of the contact pads. In FIG. 14B(iii), the effects of heating of the contact pads 1430*a*, 1430*b* above the melting temperature are shown. Above the melting temperature, the contacting metallization pad 1430*a* of the optoelectrical die 1420 and the corresponding contact pad 1430*b* of the interposer 1401, will meld together to form melded metallization 1431. Solder is used in preferred embodiments to form the contacting metallization pads. Surface tension in the molten contact metallization can be used to draw the metallization pads together, thus closing the gap between the optoelectrical die 1420 and the interposer wall containing the waveguide 1444 or other optical device on the interposer. In FIG. 14B(iii), the open arrow shows the direction of movement of the optoelectrical die 1420 upon heating of the assembly 1402 to initiate the movement of the optoelectrical die 1420 on the interposer 1401. As the gap between the optoelectrical die 1420 and the interposer wall containing the waveguide 1444 is closed, the end facet 1478 of the optical emission layer 1466 on the laser is drawn closer to the facet 1452 of core layer 1458 of the optical waveguide 1444 on the interposer 1401. In FIG. 14B(iv), the optoelectrical die 1420 is shown after lateral movement, and closure of the gap. The arrows with opposing arrowheads shown in FIGS. 14B(ii) and 14B(iii) identify the gap between the optoelectrical die 1420 and the interposer cavity wall, and the reduction or elimination of this gap upon heating above the melting temperature and the subsequent lateral movement after melding of the contacts of the optoelectrical die 1420 as shown in FIG. 14B(iv).

The melding of the contacting metallization pads 1430*a* of the optoelectrical die 1420 and the corresponding metallization pads 1430*b* of the interposer 1401 is further shown in the top-down view in FIG. 14C. In FIG. 14C(i), the optoelectrical die 1420 is shown at placement prior to the heating step corresponding to the side view shown in FIG. 14B(i). In FIG. 14C(ii), the optoelectrical die 1420 is shown after heating and alignment steps corresponding to the side view shown in FIG. 14B(iv). The top-down views shown in FIGS. 14C(i) and FIG. 14C(ii) further illustrate the role of the alignment aids 1480 of the optoelectrical die 1420 and the corresponding alignment pillars 1434 of the interposer 1401 in guiding the optoelectrical die 1420 into position on the interposer 1410. The light emitting layer 1466 of the laser pedestal 1422 is drawn closer in proximity and in alignment with the core 1458 of waveguide 1444 of the interposer 1401.

In the method of alignment shown in FIGS. 14A-14C, the meltable metal contacts are shown provided on both the mounted optoelectrical die 1420 and the interposer 1401. In other methods of alignment, the meltable metal contacts are provided only on the optoelectrical die 1420. And in yet other methods of alignment, the meltable metal contacts are provided only on the interposer 1401. Solder can be used, for example, to form the meltable metal contacts in embodiments.

The foregoing descriptions of embodiments have been presented for purposes of illustration and description and are not intended to be exhaustive or to limit embodiments to the forms disclosed. Modifications to, and variations of, the disclosed embodiments will be readily apparent to those skilled in the art, and the general principles defined herein may be applied to other embodiments without departing from the spirit and scope of the embodiments disclosed herein. Thus, embodiments should not be limited to those specifically described but rather are to be accorded the widest scope consistent with the principles and features disclosed herein.

What is claimed is:

1. A method for forming a die comprising a ridge laser structure, the method comprising concurrently forming a ridge laser emitting component of the ridge laser structure and two alignment features on a substrate, wherein the ridge laser emitting component comprises a quantum well layer for generating an optical signal, wherein a first alignment feature of the two alignment features comprises one or more first side surfaces for restricting movements of the die in a direction parallel to a lateral surface of the substrate and perpendicular to a propagation direction of the optical signal with the one or more first side surfaces disposed in a close proximity of one or more second side surfaces of an interposer when the die is mounted on the interposer, wherein a second alignment feature of the two alignment features comprises one or more exposed portions of the substrate, with the one or more exposed portions of the substrate configured to contact one or more top surfaces of the interposer, and with a first distance between at least an exposed portion of the one or more exposed portions and the optical signal being substantially the same as a second distance between at least a top surface of the one or more top surfaces and an optical pathway on the interposer, wherein the concurrently forming comprises depositing a ridge layer on a stack of layers, wherein the concurrently forming further comprises patterning the ridge layer to form a ridge element of the ridge laser emitting component and a top portion of the first alignment feature, wherein the concurrently forming further comprises patterning the stack of layers to form a bottom portion of the ridge laser emitting component comprising a quantum well and a bottom portion of the first alignment feature, wherein the concurrently forming further comprises patterning the stack of layers to expose the one or more exposed portions of the substrate.

2. A method as in claim 1, wherein the first alignment feature is formed as a recess in the die with the one or more first side surfaces being one or more sidewalls of the recess.

3. A method as in claim 1, wherein the first alignment feature is formed as a protrusion from the die with the one or more first side surfaces being one or more sidewalls of the protrusion.

4. A method as in claim 1, wherein at least a first side surface of the one or more first side surfaces comprises a curved surface.

5. A method as in claim 1, wherein the first alignment feature is configured so that during a subsequent process of moving the die in a direction comprising the propagation direction, the first alignment feature guides the die movement to obtain a desired offset of the optical signal in the direction perpendicular to the propagation direction of the optical signal, wherein the movement of the die is due to a misalignment of contact pads in the die and in the interposer.

6. A method as in claim 1, wherein the one or more first side surfaces comprise two first side surfaces with each first side surface configured to face a second side surface of the one or more second side surfaces, wherein the two first side surfaces are configured for preventing the die from moving in either of two opposite directions perpendicular to the propagation direction.

7. A method as in claim 1, wherein the one or more first side surfaces comprise two parallel first side surfaces facing away from each other, with the one or more second side surfaces disposed outside the two parallel first side surfaces.

8. A method as in claim 1, wherein the one or more first side surfaces comprise two parallel first side surfaces facing toward each other, with the one or more second side surfaces disposed inside the two parallel first side surfaces.

9. A method as in claim 1, wherein the first alignment feature comprises a wedge or a recess having a wedge shape comprising two first side surfaces, with a first first side surface of the two first side surfaces forming a first angle with the propagation direction and a second first side surface of the two first side surfaces being parallel to or forming a second angle on an opposite side of the first angle with the propagation direction.

10. A method as in claim 1, wherein the patterning the ridge layer comprises depositing a ridge mask comprising a first ridge mask portion for patterning the ridge element and a second ridge mask portion for patterning the top portion of the first alignment feature.

11. A method as in claim 1, wherein the patterning the ridge layer comprises depositing a first etch stop layer under the ridge layer, wherein the first etch stop comprises a lower etch rate than that of the ridge layer.

12. A method as in claim 10, wherein the patterning the stack of layers comprises depositing a stack mask comprising a first stack mask portion for patterning the stack of layers and a second stack mask portion for patterning the bottom portion of the first alignment feature, wherein the first stack mask portion is larger than the first ridge mask portion, wherein the second stack mask portion is similar to the second ridge mask portion.

13. A method as in claim 1, wherein the patterning the stack of layers comprises depositing a first etch stop layer on the stack of layers and under the ridge layer, followed by patterning the first etch stop layer and the stack of layers to form the bottom portion of the ridge laser emitting component and the bottom portion of the first alignment feature, wherein the first etch stop comprises a lower etch rate than that of the ridge layer.

14. A method as in claim 1, wherein the first alignment feature is formed as a recess in the die with the one or more first sides being one or more sidewalls of the recess, or wherein the first alignment feature is formed as a protrusion from the die with the one or more first sides being one or more sidewalls of the protrusion.

15. A method as in claim 1, wherein at least a first side surface of the one or more first side surfaces comprises a curved surface.

16. A method as in claim 1, wherein the first alignment feature is configured so that during a subsequent process of moving the die in a direction comprising the propagation direction, the first alignment feature guides the die movement to obtain a desired offset of the optical signal in the direction perpendicular to the propagation direction of the optical signal.

17. A method as in claim 1, wherein the one or more first side surfaces comprise two parallel first side surfaces facing away from each other, with the one or more second side surfaces disposed outside or inside the two parallel first side surfaces.

18. A method as in claim 1, wherein the first alignment feature comprises a wedge or a recess having a wedge shape.

19. A method for forming a die comprising a ridge laser structure, the method comprising concurrently forming a ridge laser emitting component of the ridge laser structure and two alignment features on a substrate, wherein the ridge laser emitting component comprises a quantum well layer for generating an optical signal, wherein a first alignment feature of the two alignment features comprises one or more first side surfaces for restricting movements of the die by the one or more first side surfaces disposed in a close proximity of one or more second side surfaces of an interposer when the die is mounted on the interposer, wherein a second alignment feature of the two alignment features comprises one or more exposed portions of the substrate, with the one or more exposed portions of the substrate configured to contact one or more top surfaces of the interposer, and with a first distance between at least an exposed portion of the one or more exposed portions and the optical signal being substantially the same as a second distance between at least a top surface of the one or more top surfaces and an optical pathway on the interposer, wherein the concurrently forming comprises depositing a ridge layer on a stack of layers on an etch stop layer, wherein the concurrently forming further comprises patterning the ridge layer to form a ridge element of the ridge laser emitting component and a top portion of the first alignment feature, wherein the concurrently forming further comprises patterning the stack of layers to form a bottom portion of the ridge laser emitting component comprising a quantum well and a bottom portion of the first alignment feature, wherein the concurrently forming further comprises patterning the stack of layers and the etch stop layer to expose the one or more exposed portions of the substrate, wherein the etch stop comprises a lower etch rate than that of the stack of layers, wherein the patterning the stack of layers comprises a different etch chemistry for the stack of layers as compared to the etch stop layer.

20. A method for forming a die comprising a ridge laser structure, the method comprising depositing a ridge layer on a stack of layers on an etch stop layer on a substrate, wherein the etch stop comprises a lower etch rate than that of the stack of layers, 5 concurrently forming a ridge laser emitting component of the ridge laser structure and two alignment features on the substrate, wherein the ridge laser emitting component comprises a quantum well layer for generating an optical signal, 10 wherein a first alignment feature of the two alignment features comprises one or more first side surfaces for restricting movements of the die by the one or more first side surfaces disposed in a close proximity of one or more second side surfaces of an interposer 15 when the die is mounted on the interposer, wherein a second alignment feature of the two alignment features comprises one or more exposed portions of the substrate, with the one or more exposed portions of the substrate configured to contact one or 20 more top surfaces of the interposer, and with a first distance between at least an exposed portion of the one or more exposed portions and the optical signal being substantially the same as a second distance between at least a top surface of the one or more top surfaces and an optical pathway on the interposer, wherein the concurrently forming comprises patterning the ridge layer to form a ridge element of the ridge laser emitting component and a top portion of the first alignment feature, wherein the concurrently forming further comprises patterning the stack of layers to form a bottom portion of the ridge laser emitting component comprising a quantum well and a bottom portion of the first alignment feature, wherein the concurrently forming further comprises patterning the stack of layers and the etch stop layer to expose the one or more exposed portions of the substrate, wherein the patterning the stack of layers comprises a different etch chemistry for the stack of layers as compared to the etch stop layer.

*   *   *   *   *